United States Patent
Yu et al.

(10) Patent No.: US 9,123,422 B2
(45) Date of Patent: Sep. 1, 2015

(54) ENDURANCE AND RETENTION FLASH CONTROLLER WITH PROGRAMMABLE BINARY-LEVELS-PER-CELL BITS IDENTIFYING PAGES OR BLOCKS AS HAVING TRIPLE, MULTI, OR SINGLE-LEVEL FLASH-MEMORY CELLS

(71) Applicant: Super Talent Technology, Corp., San Jose, CA (US)

(72) Inventors: Frank Yu, Palo Alto, CA (US); Abraham C. Ma, Fremont, CA (US); Shimon Chen, Los Gatos, CA (US); Yao-Tse Chang, Taichung (TW)

(73) Assignee: Super Talent Technology, Corp., San Jose, CA (US)

( * ) Notice: Subject to any disclaimer, the term of this patent is extended or adjusted under 35 U.S.C. 154(b) by 131 days.

(21) Appl. No.: 13/788,989

(22) Filed: Mar. 7, 2013

(65) Prior Publication Data

US 2014/0006688 A1   Jan. 2, 2014

Related U.S. Application Data

(63) Continuation-in-part of application No. 13/730,797, filed on Dec. 28, 2012, and a continuation-in-part of application No. 13/540,569, filed on Jul. 2, 2012.

(51) Int. Cl.
| | |
|---|---|
| G06F 12/00 | (2006.01) |
| G06F 13/00 | (2006.01) |
| G06F 13/28 | (2006.01) |
| G11C 16/10 | (2006.01) |
| G06F 12/02 | (2006.01) |
| G11C 13/00 | (2006.01) |
| G11C 29/00 | (2006.01) |

(52) U.S. Cl.
CPC ............ *G11C 16/10* (2013.01); *G06F 12/0246* (2013.01); *G06F 2212/7203* (2013.01); *G06F 2212/7208* (2013.01); *G11C 13/0004* (2013.01); *G11C 29/765* (2013.01); *G11C 2211/5641* (2013.01)

(58) Field of Classification Search
CPC .......... G06F 12/0246; G06F 222/7203; G06F 222/7208; G11C 2211/5641
USPC ......................................................... 711/103
See application file for complete search history.

(56) References Cited

U.S. PATENT DOCUMENTS 5,795,543 A * 8/1998 Poto et al. .................. 422/82.05
6,000,006 A * 12/1999 Bruce et al. .................... 711/103

(Continued)

*Primary Examiner* — Sheng-Jen Tsai
(74) *Attorney, Agent, or Firm* — Stuart T. Auvinen; g Patent LLC

(57) ABSTRACT

An retention flash controller reads assigned-level bits from a bad block/erase count table or from a page status table that indicate when flash memory cells operate as Triple-Level-Cell (TLC), Multi-Level-Cell (MLC), or Single-Level-Cell (SLC). Pages that fail as TLC or MLC are downgraded for use as SLC pages by changing the assigned-level bits. The level bits adjust truth tables used by translation logic that receives inputs from voltage comparators reading a bit line. The range of voltages for each logic level may be adjusted by the truth tables or by programmable registers. The programming voltage or programming pulses may be adjusted to increase endurance and the number of permitted program-erase cycles while reducing retention times before a refresh is needed of the flash cells. Mixed configurations of flash memory have MLC blocks and MLC as SLC blocks, or other combinations.

9 Claims, 37 Drawing Sheets

25% TLC AS SLC, 25% TLC AS MLC, 50% TLC

PGM/ERASE = 26,000 CYCLES

RETENTION = 39 MO.

(56) References Cited

U.S. PATENT DOCUMENTS

| | | | |
|---|---|---|---|
| 7,864,573 B2* | 1/2011 | Perlmutter et al. | 365/185.03 |
| 2007/0201274 A1* | 8/2007 | Yu et al. | 365/185.09 |
| 2008/0013372 A1* | 1/2008 | Lee et al. | 365/185.03 |
| 2008/0205137 A1* | 8/2008 | Yanagidaira et al. | 365/185.03 |
| 2009/0116288 A1* | 5/2009 | Varkony | 365/185.13 |
| 2009/0207660 A1* | 8/2009 | Hwang et al. | 365/185.03 |
| 2009/0228739 A1* | 9/2009 | Cohen et al. | 714/6 |
| 2010/0295118 A1* | 11/2010 | Bhattacharyya | 257/325 |
| 2012/0063195 A1* | 3/2012 | Lam et al. | 365/148 |
| 2012/0140569 A1* | 6/2012 | Goda et al. | 365/185.19 |
| 2014/0149648 A1* | 5/2014 | Roohparvar | 711/103 |
| 2014/0250257 A1* | 9/2014 | Khan et al. | 711/103 |

* cited by examiner

| SUB | IL0 | IU0 | IR1 | IL1 | IU1 | IR2 | IL2 | IU2 | IR3 | IL3 | IU3 | SW LVL | RD D1 | RD D0 | RD IN RG | RD > | RD < |
|---|---|---|---|---|---|---|---|---|---|---|---|---|---|---|---|---|---|
| 1 | 1 | 1 | 1 | 1 | 1 | 1 | 1 | 1 | 1 | 1 | 1 | IL0 | 1 | 1 | 0 | 0 | 1 |
| 2 | 0 | 1 | 1 | 1 | 1 | 1 | 1 | 1 | 1 | 1 | 1 | IU0 | 1 | 1 | 1 | 0 | 0 |
| 3 | 0 | 0 | 1 | 1 | 1 | 1 | 1 | 1 | 1 | 1 | 1 | IR1 | 1 | 1 | 0 | 1 | 0 |
| 4 | 0 | 0 | 0 | 1 | 1 | 1 | 1 | 1 | 1 | 1 | 1 | IL1 | 1 | 0 | 0 | 0 | 1 |
| 5 | 0 | 0 | 0 | 0 | 1 | 1 | 1 | 1 | 1 | 1 | 1 | IU1 | 1 | 0 | 1 | 0 | 0 |
| 6 | 0 | 0 | 0 | 0 | 0 | 1 | 1 | 1 | 1 | 1 | 1 | IR2 | 1 | 0 | 0 | 1 | 0 |
| 7 | 0 | 0 | 0 | 0 | 0 | 0 | 1 | 1 | 1 | 1 | 1 | IL2 | 0 | 1 | 0 | 0 | 1 |
| 8 | 0 | 0 | 0 | 0 | 0 | 0 | 0 | 1 | 1 | 1 | 1 | IU2 | 0 | 1 | 1 | 0 | 0 |
| 9 | 0 | 0 | 0 | 0 | 0 | 0 | 0 | 0 | 1 | 1 | 1 | IR3 | 0 | 0 | 0 | 1 | 0 |
| 10 | 0 | 0 | 0 | 0 | 0 | 0 | 0 | 0 | 0 | 1 | 1 | IL3 | 0 | 0 | 0 | 0 | 1 |
| 11 | 0 | 0 | 0 | 0 | 0 | 0 | 0 | 0 | 0 | 0 | 1 | IU3 | 0 | 0 | 1 | 0 | 0 |
| 12 | 0 | 0 | 0 | 0 | 0 | 0 | 0 | 0 | 0 | 0 | 0 |  | 0 | 0 | 0 | 1 | 0 |

FIG. 4

SLC MODE

FIG. 5

| SUB STATE | SWITCH LEVEL | L2 | L1 | L0 | RD D2 | RD D1 | RD D0 | RD IN RG | RD > | RD V |
|---|---|---|---|---|---|---|---|---|---|---|
| 1 | IL0 | 1 | 0 | 0 | 1 |  |  | 0 | 0 | 1 |
| 2 | IU0 | 1 | 0 | 0 | 1 |  |  | 1 | 0 | 0 |
| 3 | IR1 | 1 | 0 | 0 | 1 |  |  | 0 | 1 | 0 |
| 4 | IL1 | 1 | 0 | 0 | 1 |  |  | 0 | 0 | 1 |
| 5 | IU1 | 1 | 0 | 0 | 1 |  |  | 1 | 0 | 0 |
| 6 | IR2 | 1 | 0 | 0 | 1 |  |  | 0 | 1 | 0 |
| 7 | IL2 | 1 | 0 | 0 | 0 |  |  | 0 | 0 | 1 |
| 8 | IU2 | 1 | 0 | 0 | 0 |  |  | 1 | 0 | 0 |
| 9 | IR3 | 1 | 0 | 0 | 0 |  |  | 0 | 1 | 0 |
| 10 | IL3 | 1 | 0 | 0 | 0 |  |  | 0 | 0 | 1 |
| 11 | IU3 | 1 | 0 | 0 | 0 |  |  | 1 | 0 | 0 |
| 12 | IR4 | 1 | 0 | 0 | 0 |  |  | 0 | 1 | 0 |
| 13 | IL4 | 1 | 0 | 0 | 0 |  |  | 0 | 0 | 1 |
| 14 | IU4 | 1 | 0 | 0 | 0 |  |  | 1 | 0 | 0 |
| 15 | IR5 | 1 | 0 | 0 | 0 |  |  | 0 | 1 | 0 |
| 16 | IL5 | 1 | 0 | 0 | 0 |  |  | 0 | 0 | 1 |
| 17 | IU5 | 1 | 0 | 0 | 0 |  |  | 1 | 0 | 0 |
| 18 | IR6 | 1 | 0 | 0 | 0 |  |  | 0 | 1 | 0 |
| 19 | IL6 | 1 | 0 | 0 | 0 |  |  | 0 | 0 | 1 |
| 20 | IU6 | 1 | 0 | 0 | 0 |  |  | 1 | 0 | 0 |
| 21 | IR7 | 1 | 0 | 0 | 0 |  |  | 0 | 1 | 0 |
| 22 | IL7 | 1 | 0 | 0 | 0 |  |  | 0 | 0 | 1 |
| 23 | IU7 | 1 | 0 | 0 | 0 |  |  | 1 | 0 | 0 |
| 24 |  | 1 | 0 | 0 | 0 |  |  | 0 | 1 | 0 |

MLC MODE

| SUB STATE | SWITCH LEVEL | L2 | L1 | L0 | RD D2 | RD D1 | RD D0 | RD IN RG | RD > | RD < |
|---|---|---|---|---|---|---|---|---|---|---|
| 1 | IL0 | 1 | 1 | 0 | 1 | 1 |  | 0 | 0 | 1 |
| 2 | IU0 | 1 | 1 | 0 | 1 | 1 |  | 1 | 0 | 0 |
| 3 | IR1 | 1 | 1 | 0 | 1 | 1 |  | 0 | 1 | 0 |
| 4 | IL1 | 1 | 1 | 0 | 1 | 0 |  | 0 | 0 | 1 |
| 5 | IU1 | 1 | 1 | 0 | 1 | 0 |  | 1 | 0 | 0 |
| 6 | IR2 | 1 | 1 | 0 | 1 | 0 |  | 0 | 1 | 0 |
| 7 | IL2 | 1 | 1 | 0 | 1 | 0 |  | 0 | 0 | 1 |
| 8 | IU2 | 1 | 1 | 0 | 1 | 0 |  | 1 | 0 | 0 |
| 9 | IR3 | 1 | 1 | 0 | 1 | 1 |  | 0 | 1 | 0 |
| 10 | IL3 | 1 | 1 | 0 | 0 | 1 |  | 0 | 0 | 1 |
| 11 | IU3 | 1 | 1 | 0 | 0 | 1 |  | 1 | 0 | 0 |
| 12 | IR4 | 1 | 1 | 0 | 0 | 1 |  | 0 | 1 | 0 |
| 13 | IL4 | 1 | 1 | 0 | 0 | 1 |  | 0 | 0 | 1 |
| 14 | IU4 | 1 | 1 | 0 | 0 | 1 |  | 1 | 0 | 0 |
| 15 | IR5 | 1 | 1 | 0 | 0 | 0 |  | 0 | 1 | 0 |
| 16 | IL5 | 1 | 1 | 0 | 0 | 0 |  | 0 | 0 | 1 |
| 17 | IU5 | 1 | 1 | 0 | 0 | 0 |  | 1 | 0 | 0 |
| 18 | IR6 | 1 | 1 | 0 | 0 | 0 |  | 0 | 1 | 0 |
| 19 | IL6 | 1 | 1 | 0 | 0 | 0 |  | 0 | 0 | 1 |
| 20 | IU6 | 1 | 1 | 0 | 0 | 0 |  | 1 | 0 | 0 |
| 21 | IR7 | 1 | 1 | 0 | 0 | 0 |  | 0 | 1 | 0 |
| 22 | IL7 | 1 | 1 | 0 | 0 | 0 |  | 0 | 0 | 1 |
| 23 | IU7 | 1 | 1 | 0 | 0 | 0 |  | 1 | 0 | 0 |
| 24 |  | 1 | 1 | 0 | 0 | 0 |  | 0 | 1 | 0 |

FIG. 6

TLC MODE

| SUB STATE | SWITCH LEVEL | L2 | L1 | L0 | RD D2 | RD D1 | RD D0 | RD IN RG | RD > | RD < |
|---|---|---|---|---|---|---|---|---|---|---|
| 1 | IL0 | 1 | 1 | 1 | 1 | 1 | 1 | 0 | 0 | 1 |
| 2 | IU0 | 1 | 1 | 1 | 1 | 1 | 1 | 1 | 0 | 0 |
| 3 | IR1 | 1 | 1 | 1 | 1 | 1 | 0 | 0 | 1 | 0 |
| 4 | IL1 | 1 | 1 | 1 | 1 | 1 | 0 | 0 | 0 | 1 |
| 5 | IU1 | 1 | 1 | 1 | 1 | 1 | 0 | 1 | 0 | 0 |
| 6 | IR2 | 1 | 1 | 1 | 1 | 0 | 1 | 0 | 1 | 0 |
| 7 | IL2 | 1 | 1 | 1 | 1 | 0 | 1 | 0 | 0 | 1 |
| 8 | IU2 | 1 | 1 | 1 | 1 | 0 | 1 | 1 | 0 | 0 |
| 9 | IR3 | 1 | 1 | 1 | 1 | 0 | 0 | 0 | 1 | 0 |
| 10 | IL3 | 1 | 1 | 1 | 1 | 0 | 0 | 0 | 0 | 1 |
| 11 | IU3 | 1 | 1 | 1 | 1 | 0 | 0 | 1 | 0 | 0 |
| 12 | IR4 | 1 | 1 | 1 | 0 | 1 | 1 | 0 | 1 | 0 |
| 13 | IL4 | 1 | 1 | 1 | 0 | 1 | 1 | 0 | 0 | 1 |
| 14 | IU4 | 1 | 1 | 1 | 0 | 1 | 1 | 1 | 0 | 0 |
| 15 | IR5 | 1 | 1 | 1 | 0 | 1 | 0 | 0 | 1 | 0 |
| 16 | IL5 | 1 | 1 | 1 | 0 | 1 | 0 | 0 | 0 | 1 |
| 17 | IU5 | 1 | 1 | 1 | 0 | 1 | 0 | 1 | 0 | 0 |
| 18 | IR6 | 1 | 1 | 1 | 0 | 0 | 1 | 0 | 1 | 0 |
| 19 | IL6 | 1 | 1 | 1 | 0 | 0 | 1 | 0 | 0 | 1 |
| 20 | IU6 | 1 | 1 | 1 | 0 | 0 | 1 | 1 | 0 | 0 |
| 21 | IR7 | 1 | 1 | 1 | 0 | 0 | 0 | 0 | 1 | 0 |
| 22 | IL7 | 1 | 1 | 1 | 0 | 0 | 0 | 0 | 0 | 1 |
| 23 | IU7 | 1 | 1 | 1 | 0 | 0 | 0 | 1 | 0 | 0 |
| 24 |  | 1 | 1 | 1 | 0 | 0 | 0 | 0 | 1 | 0 |

FIG. 7

AFTER ERASE

FIG. 8

| SUB STATE | SWITCH LEVEL | L2 | L1 | L0 | WR D2 | WR D1 | WR D0 |
|---|---|---|---|---|---|---|---|
| 2 | IU0 | 0 | 0 | 0 | 1 | | |

SLC MODE

FIG. 9

| SUB STATE | SWITCH LEVEL | L2 | L1 | L0 | WR D2 | WR D1 | WR D0 |
|---|---|---|---|---|---|---|---|
| 2 | IU0 | 1 | 0 | 0 | 1 | | |
| 14 | IU4 | 1 | 0 | 0 | 0 | | |

MLC MODE

FIG. 10

| SUB STATE | SWITCH LEVEL | L2 | L1 | L0 | WR D2 | WR D1 | WR D0 |
|---|---|---|---|---|---|---|---|
| 2 | IU0 | 1 | 1 | 0 | 1 | 1 |  |
| 8 | IU2 | 1 | 1 | 0 | 1 | 0 |  |
| 14 | IU4 | 1 | 1 | 0 | 0 | 1 |  |
| 20 | IU6 | 1 | 1 | 0 | 0 | 0 |  |

TLC MODE

FIG. 11

| SUB STATE | SWITCH LEVEL | L2 | L1 | L0 | WR D2 | WR D1 | WR D0 |
|---|---|---|---|---|---|---|---|
| 2 | IU0 | 1 | 1 | 1 | 1 | 1 | 1 |
| 5 | IU1 | 1 | 1 | 1 | 1 | 1 | 0 |
| 8 | IU2 | 1 | 1 | 1 | 1 | 0 | 1 |
| 11 | IU3 | 1 | 1 | 1 | 1 | 0 | 0 |
| 14 | IU4 | 1 | 1 | 1 | 0 | 1 | 1 |
| 17 | IU5 | 1 | 1 | 1 | 0 | 1 | 0 |
| 20 | IU6 | 1 | 1 | 1 | 0 | 0 | 1 |
| 23 | IU7 | 1 | 1 | 1 | 0 | 0 | 0 |

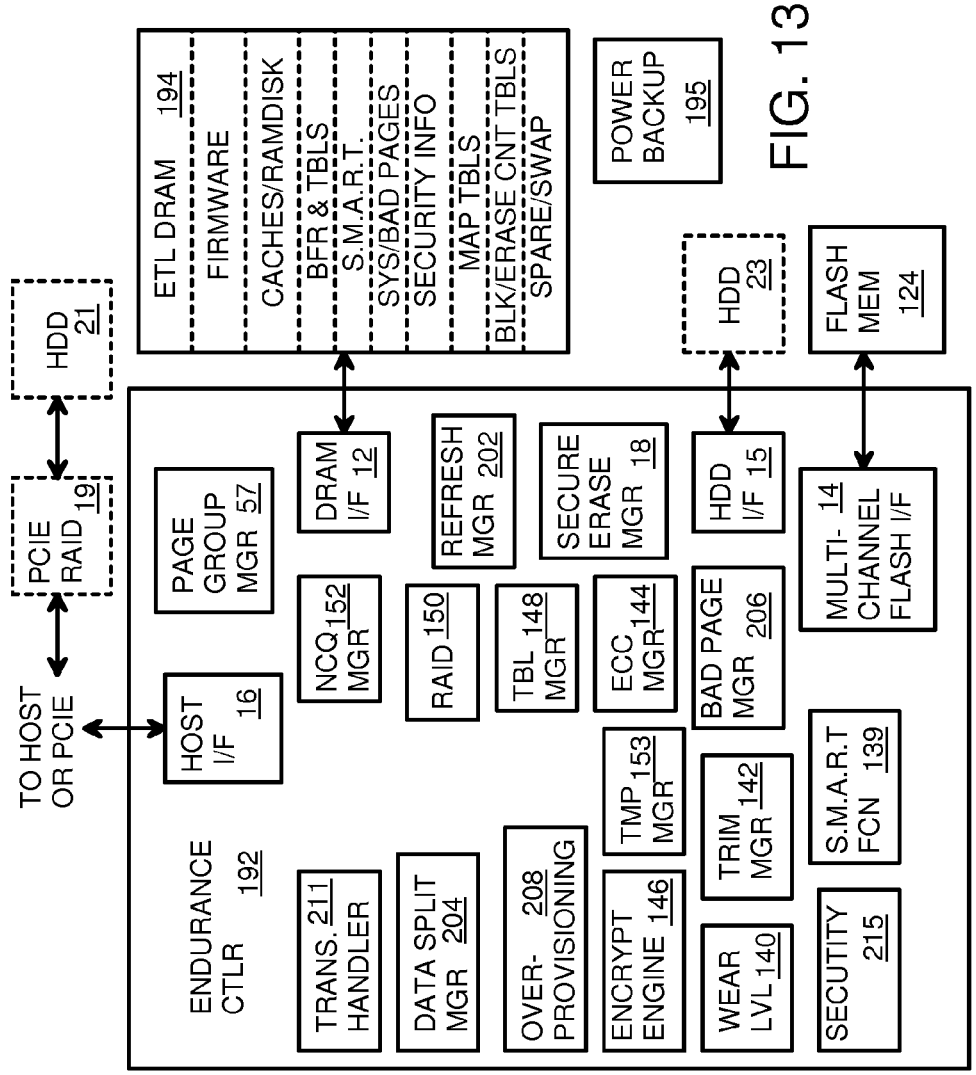

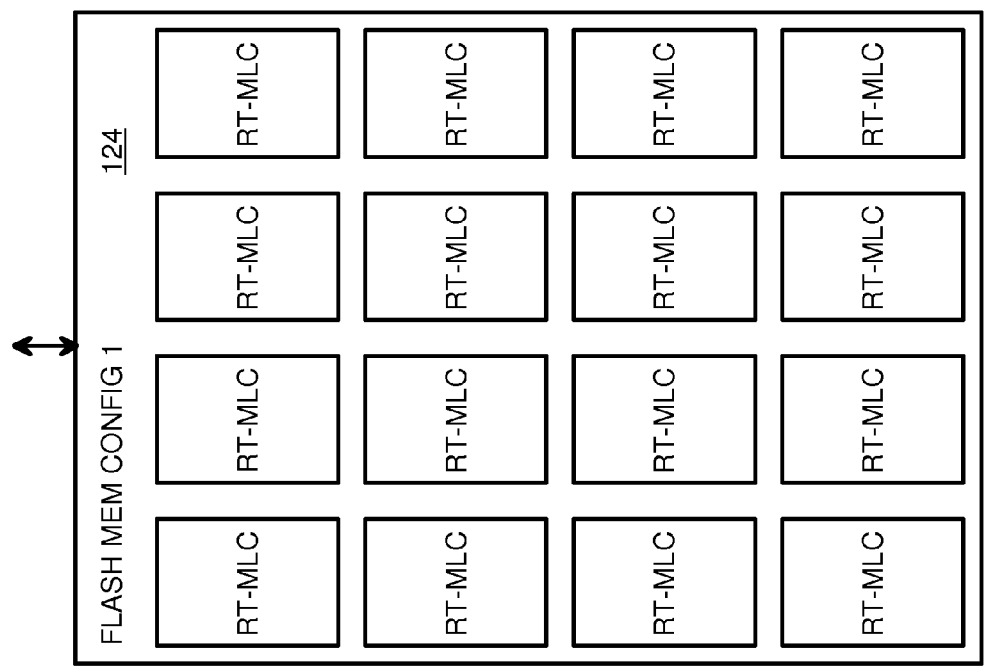

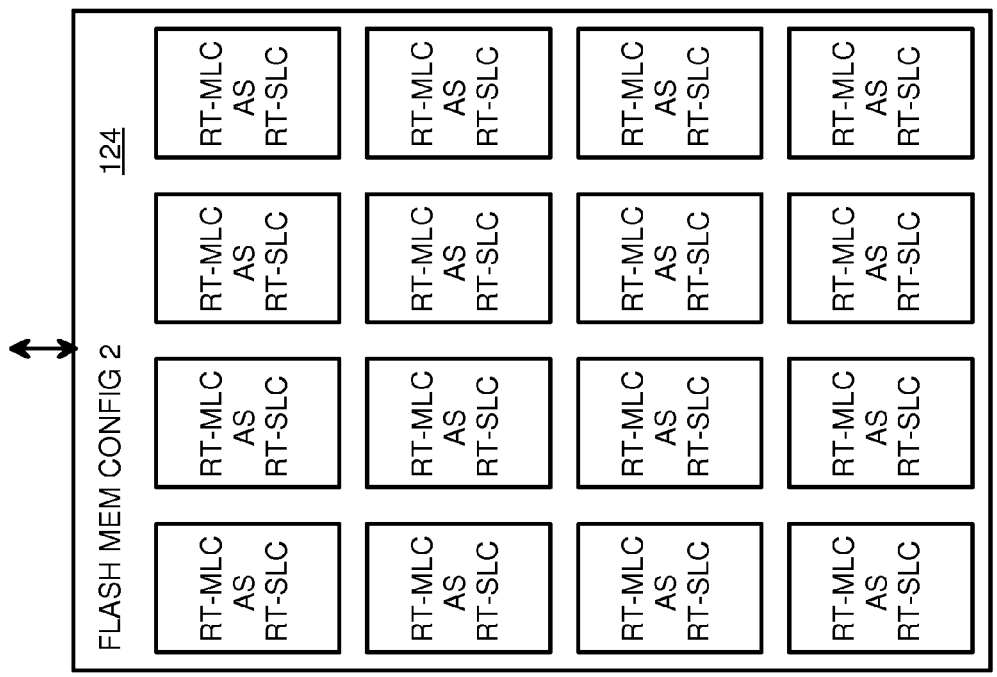

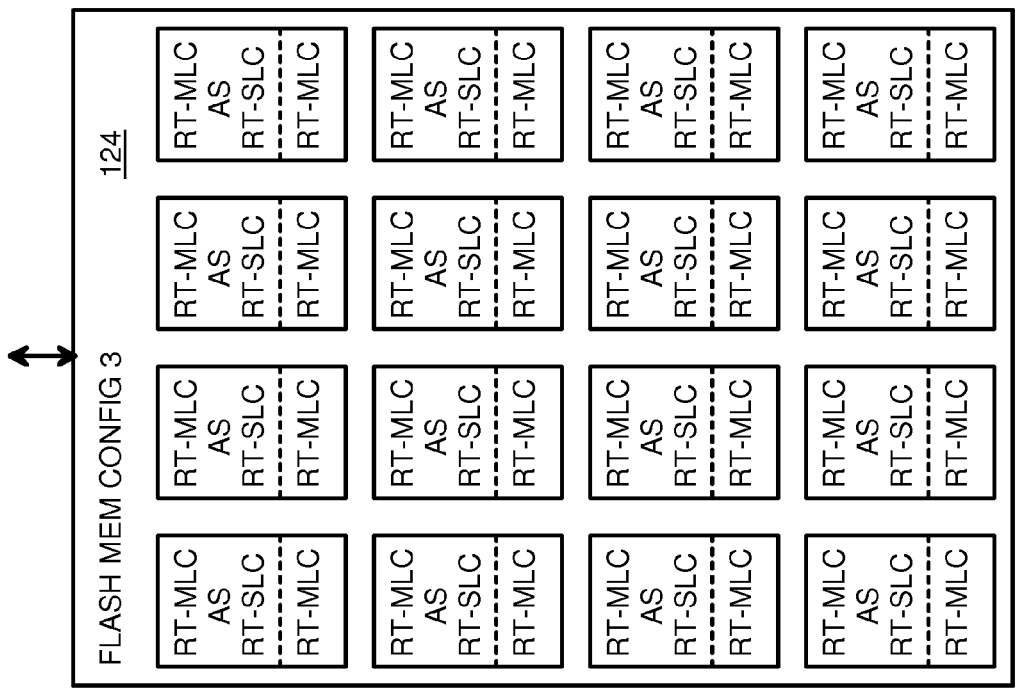

FIG. 15

BLK WRITE WEEK STORED

BLOCK STATUS

000 EMPTY BLK
001 USED BLK
010 BLK WITH GARBAGE
011 WHOLE BLK BAD
100 EMPTY BLK, BAD PAGES
101 USED BLK, BAD PAGES
110 BLK WITH GARBAGE, BAD PAGES
111 FACTORY BAD BLK

PAGE STATUS

000 EMPTY PAGE
001 EMPTY PAGE +PROTECT
010 USED PAGE
011 USED PAGE +PROTECT
100 GARBAGE PAGE
101 GARBAGE PAGE +PROTECT
110 TLC,MLC BAD PAGE, SLC PAGE OK
111 TLC,MLC & SLC BAD PAGE

| WRITE DATE $8^b$ | ERASE CNT $19^b$ | ASGN'ED LEVEL $2^b$ | BLK STATUS $3^b$ |
|---|---|---|---|

BAD BLK/ERASE CNT TABLE  471

| | PG STATUS $3^b$ |
|---|---|

473

PAGE STATUS TABLE

100% eMLC
PGM/ERASE = 30,000 CYCLES
RETENTION = 3 MO.

100% eMLC AS SLC
PGM/ERASE = 300,000 CYCLES
RETENTION = 36 MO.

25% eMLC AS SLC
PGM/ERASE = 97,500 CYCLES
RETENTION = 11.25 MO.

100% MLC

PGM/ERASE = 3,000 CYCLES

RETENTION = 12 MO.

100% MLC AS SLC

PGM/ERASE = 100,000 CYCLES

RETENTION = 120 MO.

ENDURANCE ED-MLC

25% MLC AS SLC

PGM/ERASE = 27,250 CYCLES

RETENTION = 39 MO.

100% TLC

PGM/ERASE = 500 CYCLES

RETENTION = 12 MO.

100% TLC AS MLC

PGM/ERASE = 3,000 CYCLES

RETENTION = 12 MO.

ENDURANCE ED-MLC

100% TLC AS SLC

PGM/ERASE = 100,000 CYCLES

RETENTION = 120 MO.

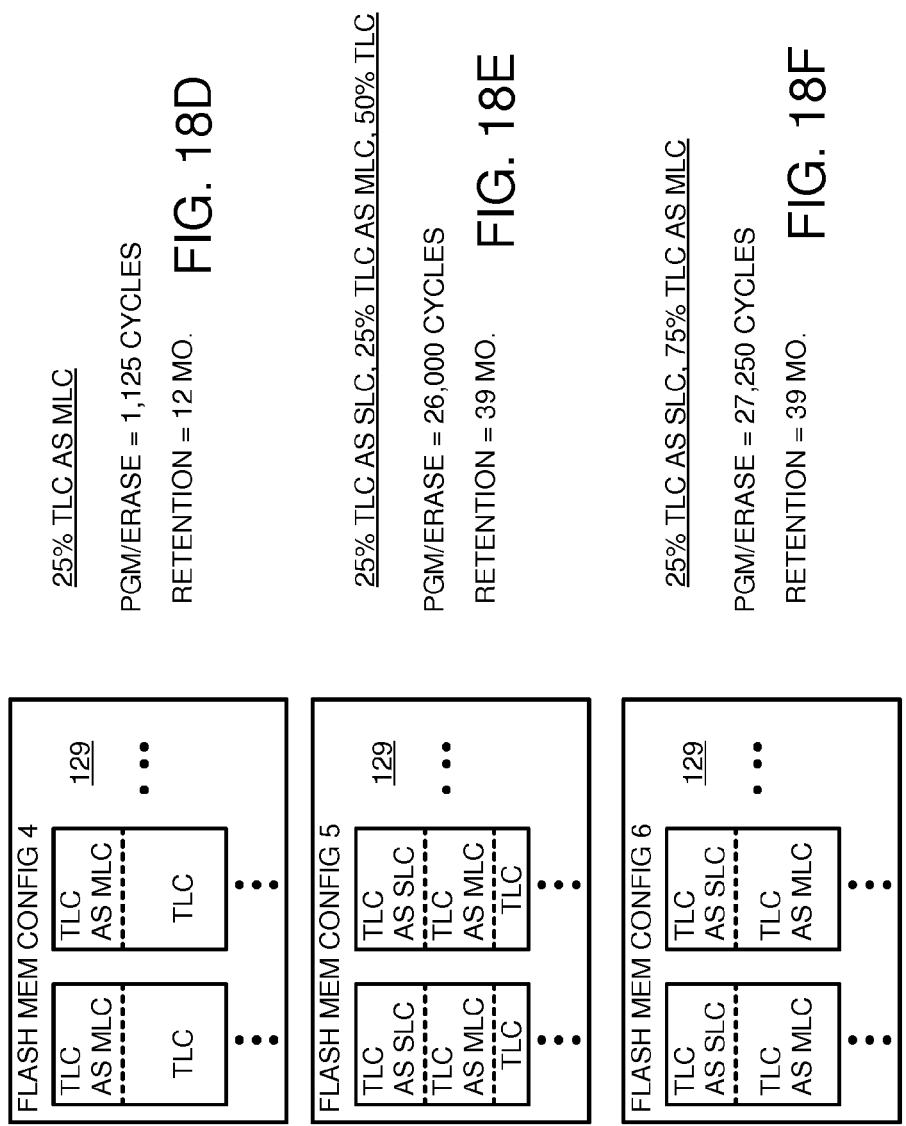

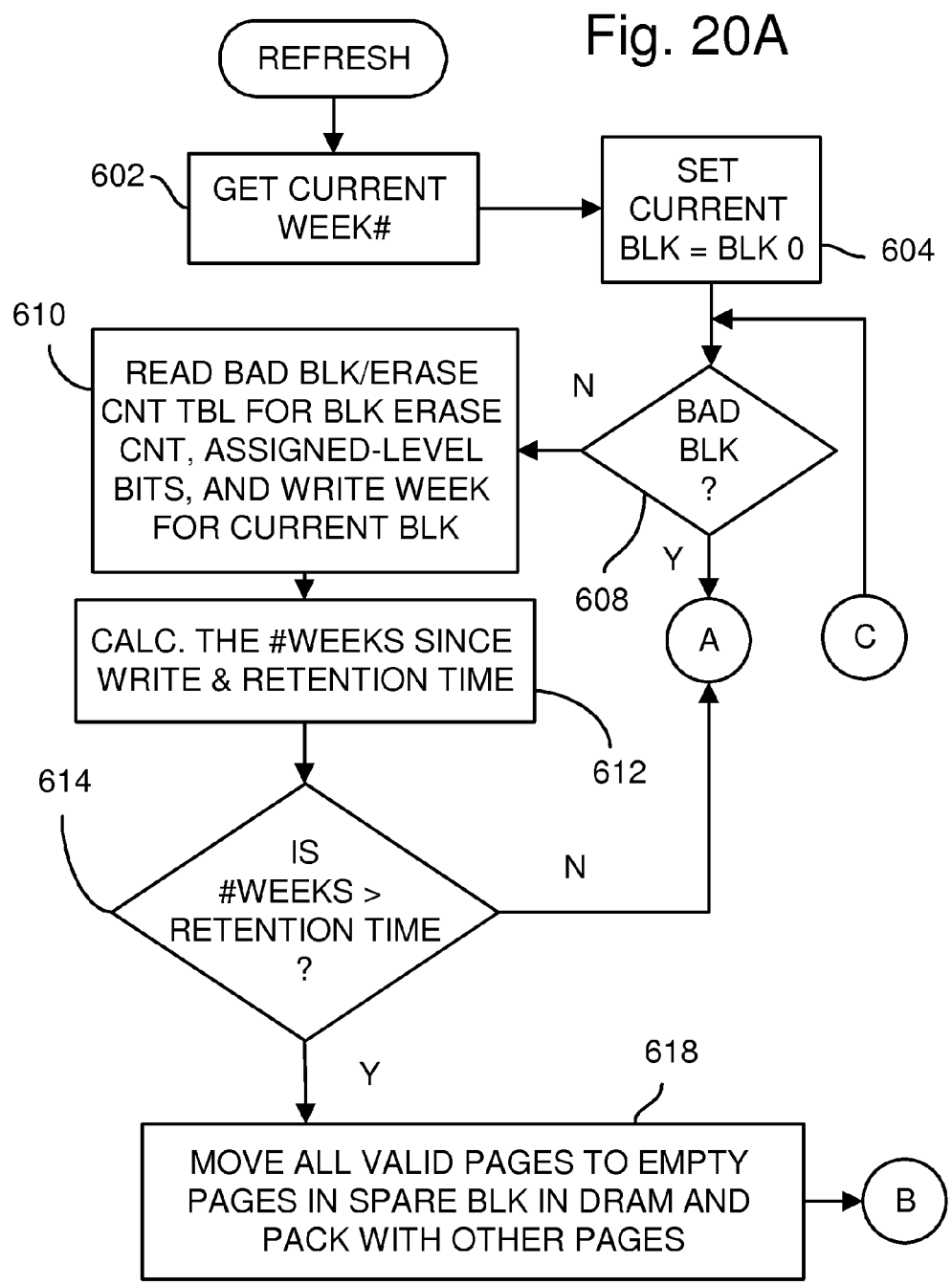

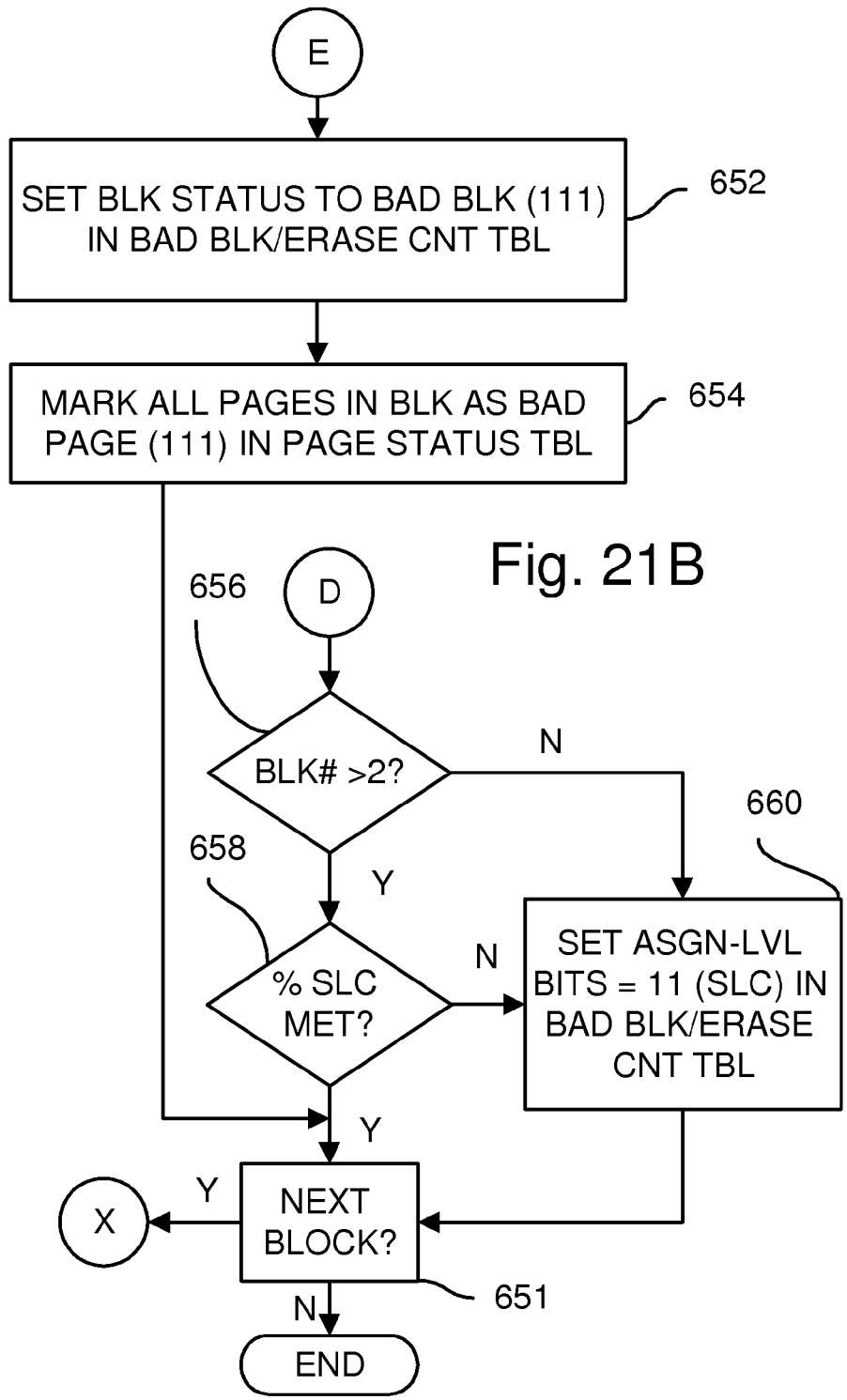

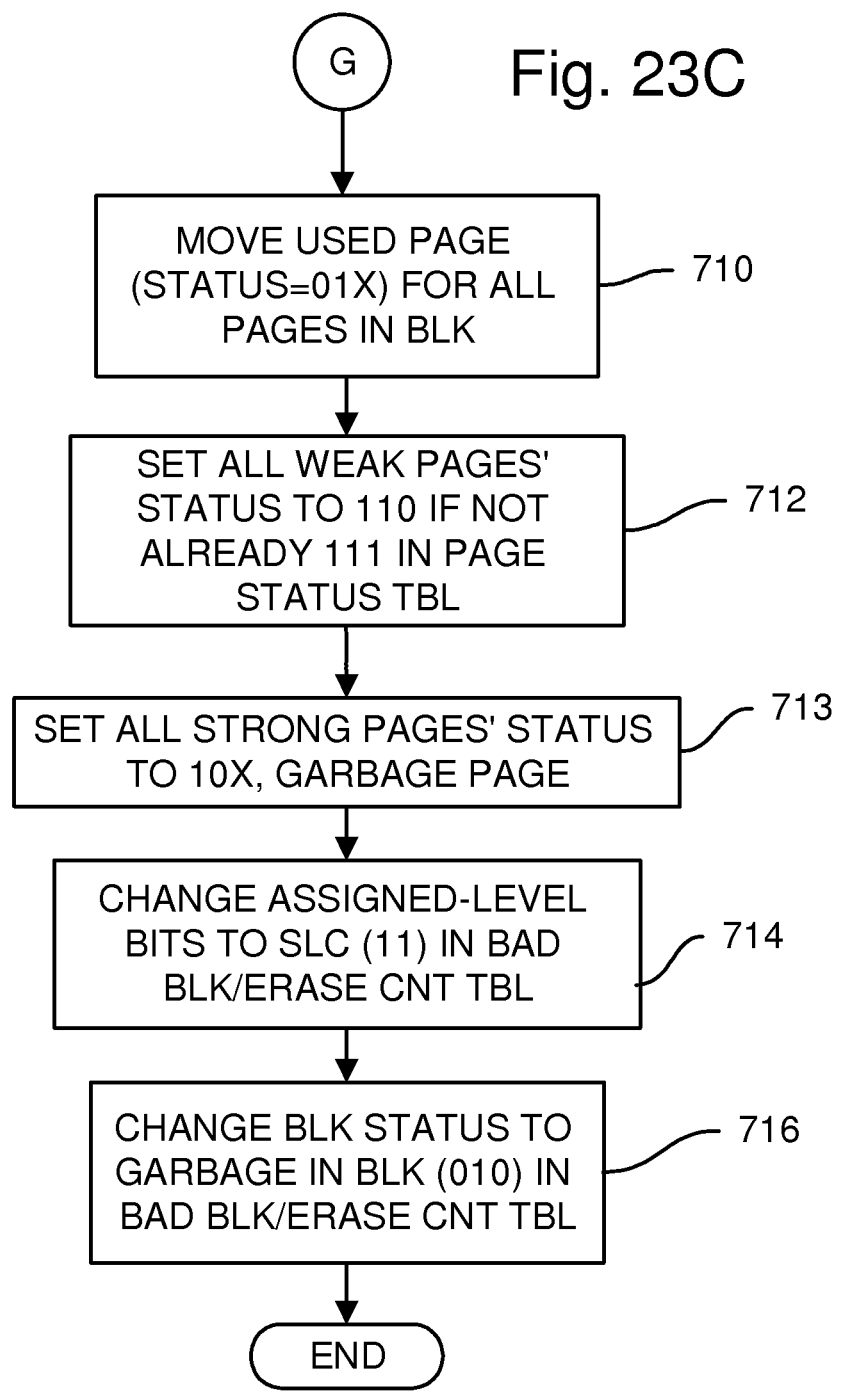

ENDURANCE AND RETENTION FLASH CONTROLLER WITH PROGRAMMABLE BINARY-LEVELS-PER-CELL BITS IDENTIFYING PAGES OR BLOCKS AS HAVING TRIPLE, MULTI, OR SINGLE-LEVEL FLASH-MEMORY CELLS

RELATED APPLICATION

This application is a continuation-in-part (CIP) of "Super-Endurance Solid-State Drive with Endurance Translation Layer (ETL) and Diversion of Temp Files for Reduced Flash Wear", U.S. Ser. No. 13/540,569, filed on Jul. 2, 2012.

This application is a continuation-in-part (CIP) of "Virtual Memory Device (VMD) Application/Driver with Dual-Level Interception for Data-Type Splitting, Meta-Page Grouping, and Diversion of Temp Files to Ramdisks for Enhanced Flash Endurance", U.S. Ser. No. 13/730,797, filed on Dec. 28, 2012.

FIELD OF THE INVENTION

This invention relates to Solid-State Drive (SSD) systems, and more particularly to flash controllers that adaptively program single or multi-level cells.

BACKGROUND OF THE INVENTION

Mass storage is used to store large amounts of data that is typically copied to a faster random-access memory such as a dynamic-random-access memory (DRAM) for use by a processor. While the processor's DRAM is randomly accessible, mass storage is block-accessible. An entire block of data must be read or written from the mass storage device. A RAM may allow reading and writing of individual bytes or words of 4 or 8 bytes, while a mass storage device requires that a sector or 512 bytes or more be read or written together.

Solid-State Drives (SSD) contain flash memory and may be used as a mass storage device in lieu of a hard disk. Flash-memory arrays are also block-accessible, but have a much faster access time than rotating media such as a hard disk. However, since flash memory chips are block-addressable rather than randomly-accessible, flash is not as easy to use for a cache as DRAM or SRAM.

While an entire block has to be erased together, pages within a block could be written and over-written several times. Some older flash memory chips may allow over-writing of pages that have previously been written. Blocks with all stale pages could be erased and re-used.

Older flash memory chips used electrically-erasable programmable read-only memory (EEPROM) memory cells that stored one bit of data per memory cell. Each cell could be in one of two states. When the floating gate in the flash memory cell was charged with electrons, a higher (more positive) gate voltage is needed to turn on the conducting transistor channel. When the floating gate in the flash memory cell was not charged with electrons, a lower (less positive) gate voltage is needed to turn on the conducting transistor channel.

Newer flash memory chips use EEPROM memory cells that store two, four, or more bits of data per memory cell. Different amounts of charge stored on the floating gates produce different current and different sensing voltages for the same memory cell. Thus a single memory cell can store multiple bits of information by assigning different voltages to different logic levels.

Higher density flash memory use multiple voltage levels to store more than one bit per physical flash memory cell. Older Single-Level-Cell (SLC) flash stored just one binary bit per memory cell. Multi-Level-Cell (MLC) stores two bits per cell by having four voltage levels correspond to the four possible logic states of the two binary bits. Triple-Level-Cell (TLC) flash memories store three binary bits per physical cell, and have eight possible logic states and 8 voltage levels. Quad-Level-Cell (QLC) flash memories store four binary bits per physical cell, and have sixteen possible logic states and 16 voltage levels. Other flash types may have more binary bits per memory cell.

Having many logic levels per cell reduces the voltage difference between logic states, resulting in a reduced noise margin. Thus higher-density cells tend to have a lower reliability. Programming must be more exact since the voltage range of any one logic state is smaller, and this precise programming may require more time, and may create more wear on the memory cells, resulting in a lower endurance, or number of program-erase cycles before the cell wears out and fails.

As process technologies shrink the size of the flash memory cell, insulating oxide layers are also shrunk, causing the memory cells to wear out and fail after a smaller number of program-erase cycles. Newer flash chips may only allow for a few thousand or even a few hundred program-erase cycles before the cells become unreliable. Cell leakage also may become a problem.

What is desired is a flash memory system that allows some pages to be programmed as higher-density TLC or MLC, and other pages to be programmed as more reliable SLC. A flash controller that adjusts voltage levels is desirable to allow for more reliable reading of flash cells that have been programmed as TLC, MLC, or SLC cells. A dynamic flash controller that can control a hybrid flash memory with blocks of TLC, MLC, and SLC memory is desirable. A flash controller that refreshes flash memory cells to allow for some leakage over time is also desirable.

BRIEF DESCRIPTION OF THE DRAWINGS

FIG. 4 is a truth table for translation logic for a 2-bit MLC.

FIG. 5 is a truth table for a TLC flash chip reading a page in SLC mode.

FIG. 6 is a truth table for a TLC flash chip reading a page in MLC mode.

FIG. 7 is a truth table for a TLC flash chip reading a page in TLC mode.

FIG. 8 shows the state of a TLC memory cell after erase.

FIG. 9 shows the TLC flash cell being programmed in SLC mode.

FIG. 10 shows the TLC flash cell being programmed in MLC mode.

FIG. 11 shows the TLC flash cell being programmed in TLC mode.

FIG. 13 is a block diagram of a flash endurance controller.

FIG. 14A-C highlight configurations of blocks of flash memory that include mixed modes of retention-MLC (RT-MLC).

FIG. 15 shows bad block/erase count tables and page status tables that store assigned-level bits.

FIGS. 18A-F show mixed flash-memory configurations for TLC devices.

FIGS. 20A-B show a flash block refresh operation using the tables in FIG. 15.

FIGS. 21A-B show a flowchart of setting up a mixed configuration of RT-MLC and RT-SLC blocks.

FIGS. 23A-C show a process for detection and handling of bad pages and bad blocks.

DETAILED DESCRIPTION

The present invention relates to an improvement in adaptive Multi-Level-Cell (MLC) flash chips. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
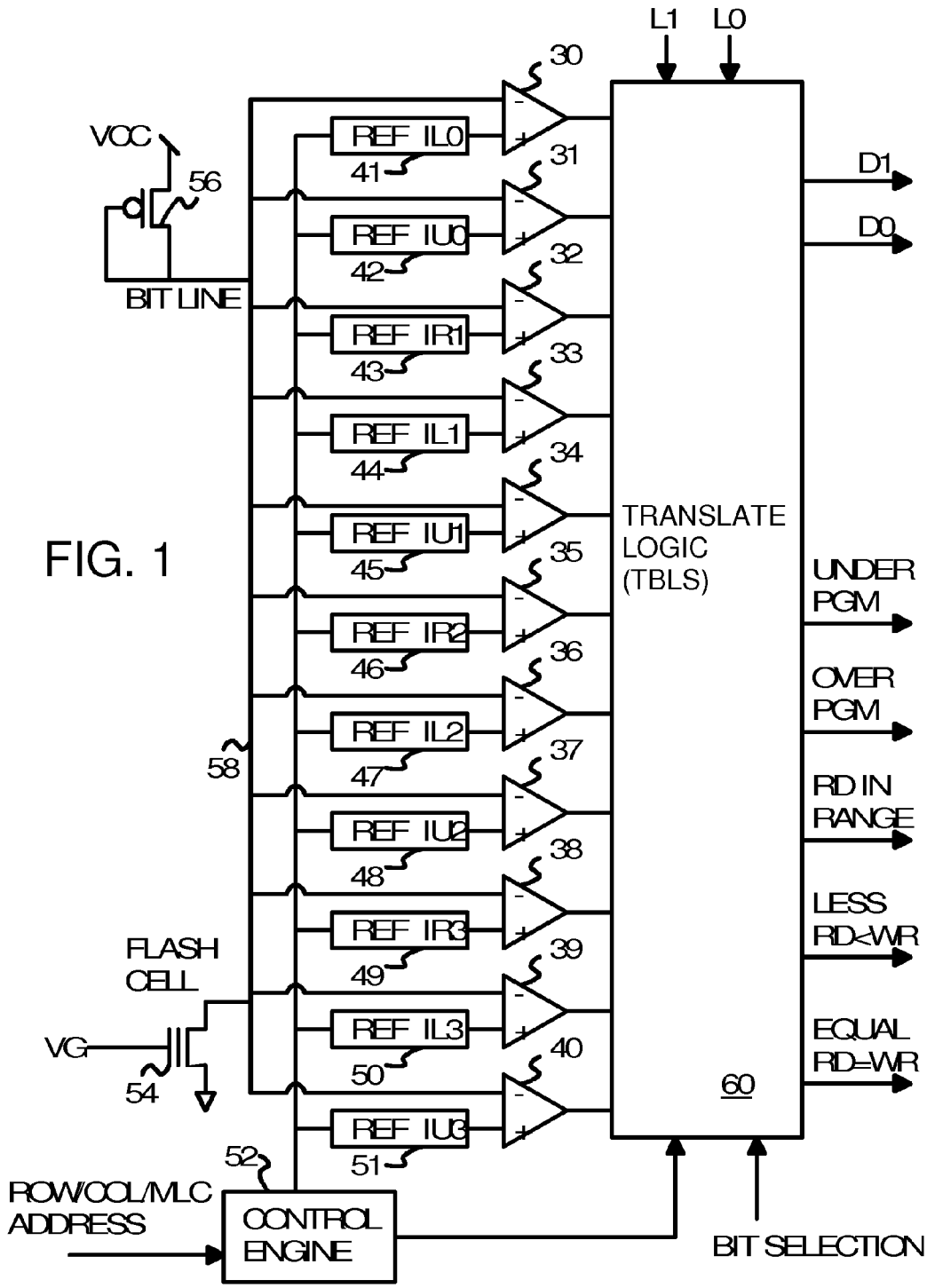
FIG. 1 shows multi-level voltage sensing of a MLC cell with binary-levels per cell bits.
Figure 2:
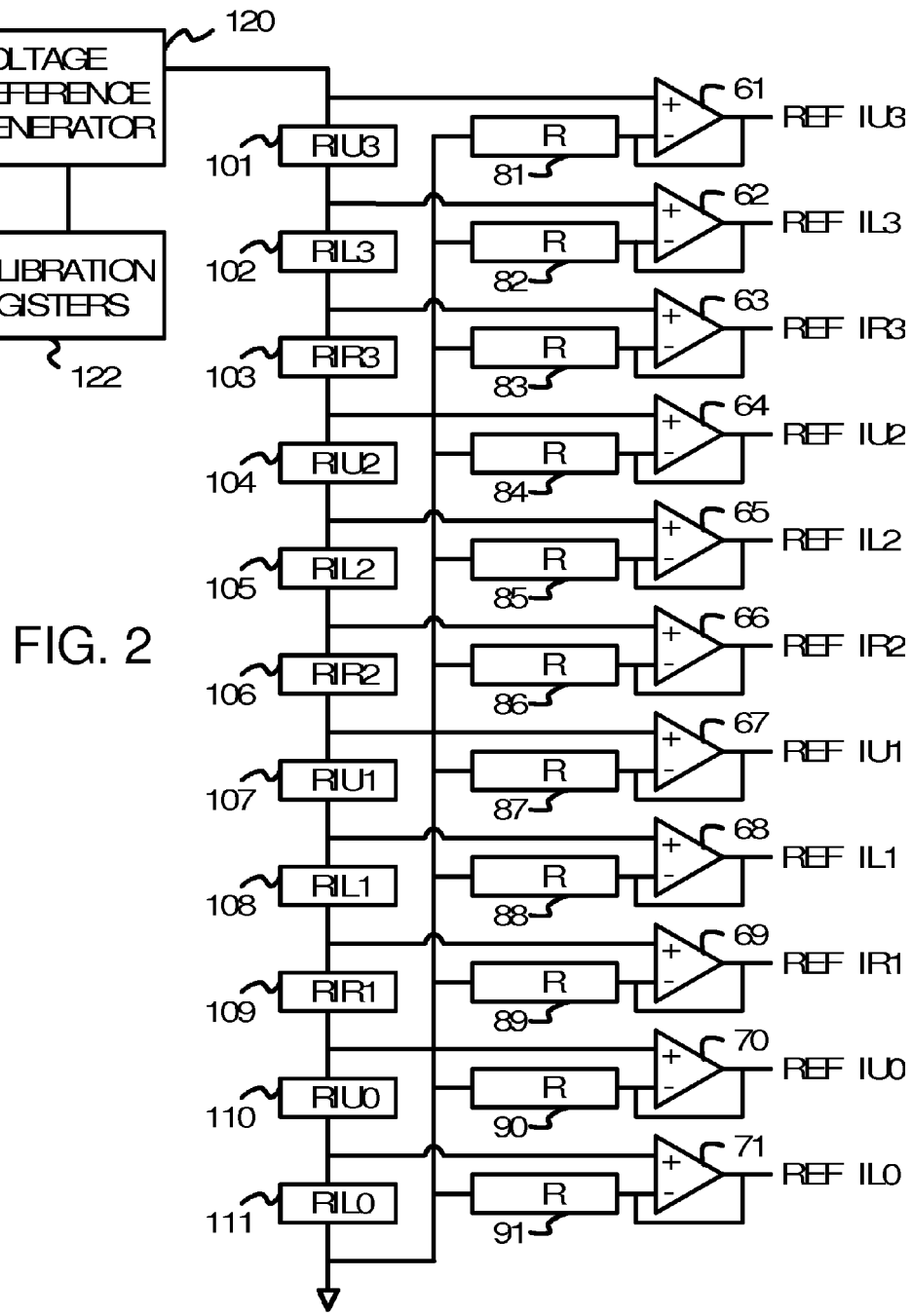
FIG. 2 shows a programmable series of reference generators and operational amplifiers.
Figure 3:
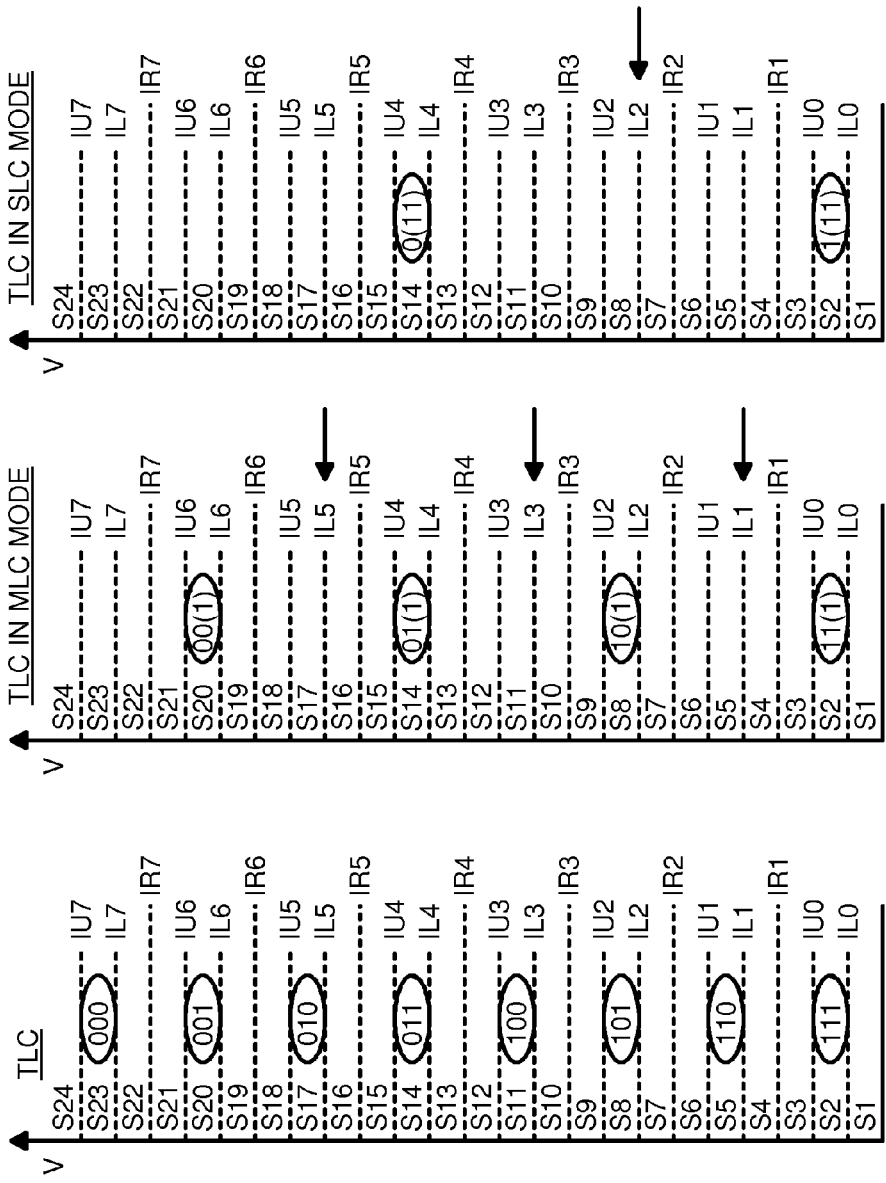
FIGS. 3A-C shows voltage levels for TLC in TLC, MLC, and SLC use.

FIG. 1 shows multi-level voltage sensing of a MLC cell. The example of FIGS. 1-2 show a 2-bit, 4-state MLC, but other examples could be devised for other sizes, such as 4-bit, 16-state QLC memory.

A flash-memory chip has an array of flash cells arranged in rows and columns that are selectable by a row portion of an address and a column portion of an address. The address may be generated internally by a sequencer from a block or page address that is input to the flash-memory chip. A third part of the address effectively selects the bit within a MLC cell.

Control engine 52 receives the address and selects one or more flash cells at an intersection of the selected row and column. The MLC address is sent to translation logic 60, which generates multiple bits per cell. One or more of the bits per cell output by translation logic 60 is selected by the MLC address from control engine 52. Typically, 8 or more flash cells are read and sensed in parallel on 8 or more bit lines by 8 or more copies of translation logic 60, but only bit slice is shown.

Bit line 58 is pre-charged by pull-up transistor 56. Selected flash cell 54 is in the flash array at an intersection of the selected row and column, and has a gate voltage VG applied that may turn on its channel, depending on the state of selected flash cell 54. The different states that may be programmed into selected flash cell 54 each store a different amount of charge on the floating gate of selected flash cell 54, so each state thus causes a different amount of channel current to pass through selected flash cell 54, from bit line 58 to ground. The variable current through selected flash cell 54, combined with the pull-up current from pull-up transistor 56 forms a voltage divider. The voltage on bit line 58 thus varies with the state that was in the selected flash cell 54.

Bit line 58 is applied to the inverting inputs of comparators 30-40. The non-inverting inputs to comparators 30-40 are reference voltages that are generated by reference-current generators 41-51. The voltages generated by reference-current generators 41-51 are controlled by control engine 52 and correspond to reference, upper, and lower state voltages for sensing the four cell states.

The voltages generated by reference-voltage generators 41-51 are successively higher voltages. The bit-line voltage exceeds the lower references, clearing the outputs of the lower-state comparators, while the bit-line voltage does not exceed the higher references, causing the outputs of higher-state references to remain high. The location of the transition from comparators 30-40 outputting a 0 to comparators 30-40 outputting a 1 indicates the sensed voltage of bit line 58. For example, when comparators 30-37 output a 0 and comparators 38-40 output a 1, the transition from 0 to 1 occurs between comparators 37, 38. Voltage IU2 is applied to comparator 37 while voltage IR3 is applied to comparator 38. The voltage of bit line 38 is between IU2 and IR3, which is read as state 3 (01).

Translation logic 60 receives eleven comparator outputs from comparators 30-40 and detects the location of the transition from 0 to 1. Translation logic 60 generates several outputs, such as read data D1, D0, which are 2 binary bits that encode the state read from the cell. A 3-bit TLC would have more logic levels and comparators and have a translation logic that outputs three read-data bits D2, D1, D0.

Other outputs from translation logic 60 are useful during cell programming. As the cell is slowly charged or discharged during programmed, the voltage on bit line 58 changes. Programming stops once the desired data is read from data-read outputs D1, D0. However, to ensure a sufficient noise margin, the bit-line voltage should be between the upper and lower state voltages, such as VL2, VU2, rather than just between the adjacent read-reference voltages, such as VR2, VR3. The under-program output is activated when the bit-line voltage is between VR2 and VL2, while the over-program output is activated when the bit-line voltage is between VU2 and VR3. When the bit-line voltage is between the target of VL2, VU2, neither the under-program nor the over-program outputs are activated. The read-in-range output can then be activated.

The less and equal outputs can also be activated to indicate when a desired cell value has been reached. Bit selection inputs can supply the write data to translation logic 60 to allow the less and equal outputs to target one logic state. Translation logic 60 can implement a truth table, such as shown later in FIGS. 4-11. Reference-current generators 41-51 can generate reference currents or reference voltages when comparators 30-40 are current comparators, since the reference current sent through a resistance generates a reference voltage.

Level inputs L1, L0 are also applied to translation logic 60. The memory cell being read may be programmed as a SLC cell or as a MLC cell. When L1, L0 is 10, the cell is SLC and translation logic 60 implements logic that programs or reads only one binary bit (FIG. 5). When L1, L0 is X1 (11 or 01), the cell is MLC and translation logic 60 implements logic that programs or reads two binary bits (FIG. 6).

These level bits L1, L0 are programmable bits for every grouped or paired pages of flash cells. L1 is for the stronger page (with its memory cells operating with one binary level per cell, or SLC) and L0 is for the weaker page (with its memory cells operating with two binary levels per cell, or MLC). These level bits are inactive when the block is erased and are changed to active only when the corresponding page is programmed. Thus, the two level bits L1, L0 for the flash chip can help translation logic 60 to determine that the paired pages are programmed for weak pages (MLC) or only for strong pages (SLC). If only strong pages have been programmed, translation logic 60 can have a different decoding result to improve noise margins against read errors due to the electron loss/gain in the depletion layer due to the noise.

FIG. 2 shows a programmable series of reference generators and operational amplifiers. Voltage reference generator 120 generates an upper reference voltage that is applied to upper operational amplifier 61 and to upper resistor 101. Calibration registers 122 can be programmed to different values to adjust the value of the upper reference voltage generated by voltage reference generator 120.

The upper reference voltage is applied to a chain of resistors 101-111, forming a voltage divider to ground. The resistance values of each resistor 101-111 can be the same, so that the voltage difference between the upper reference voltage and ground can be split into 11 equal voltage segments, producing 11 divider voltages. Alternately, each resistor 101-111 can have a different programmable value to provide more voltage control.

Each of the divider voltages from resistors 101-111 is applied to the non-inverting (+) input of one of operational amplifiers 61-71. The output and inverting (−) input of each of operational amplifiers 61-71 are connected together for very high gain. The inverting inputs are connected to ground through grounding resistors 81-91, which can all have the same resistance values. Each of operational amplifiers 61-71 produces a reference voltage that is equal to the divider voltage applied to its non-inverting input. Thus 11 reference voltages are produced that have voltage values that steadily increase. These reference currents correspond to those produced by reference-voltage generators 41-51 of FIG. 1.

When data errors occur during reading of flash cells, the reference voltages that are compared to the bit-line voltage can be adjusted to try to recover the data in the flash cell. For example, leakage may have reduced the charge stored in the floating gate of the flash cell, causing too much current to be drawn through the channel of selected flash cell 54 (FIG. 1). The bit-line voltage is thus lowered. Calibration registers 122 can be re-programmed to reduce the upper reference voltage that voltage reference generator 120 creates, lowering all of the reference voltages applied to operational amplifiers 61-71. The bit-line voltage may now fall within the correct reference values, allowing the data to be read without exceeding the maximum allowable ECC errors.

Calibration registers 122 could be gradually changed until the data read has no errors. The ECC bytes can be used to detect errors, so when the ECC checker reports few or no errors, then the reference-voltage adjustment can stop and the data read. The block can be relocated to avoid going through this time consuming fix for the next read.

While FIGS. 1-2 show logic for MLC, additional resistors, comparators, and other components may be added to double the number of voltage levels, allowing for TLC reading and programming. FIGS. 3-11 show diagrams and logic truth tables for such an expansion of FIGS. 1-2 for TLC to support adaptive TLC flash that can be programmed as TLC, MLC, and SLC.

A third level bit L2 is input to translation logic 60 in FIG. 1. This third level bit L2 is programmed to a one when the SLC page has been programmed. The middle level bit L1 is programmed to a one when the MLC page has been programmed. The first level bit L0 is programmed to a one when the TLC page has been programmed. The SLC page (L1=1) is known as the strong page, while the TLC page (L0=1) is known as the weak page, since it has smaller voltage noise margins.

FIGS. 3A-C shows voltage levels for TLC in TLC, MLC, and SLC use. FIG. 3A shows the flash memory reference voltage levels when the memory cell is programmed for TLC. TLC has three binary bits and a total of eight states, 000, 001, . . . 111. The bit-line voltage read from the substrate or chip is shown on the Y-axis. There are 24 substrate states labeled S1, S2, . . . S24, each having a slightly higher range of voltages.

When the data to be programmed is 100, the programming pulses are applied until the cell's voltage is in substrate state S11, between lower limit voltage IL3 and upper limit voltage IU3. During a subsequent read, if the voltage read is between reference voltages IR3 and IR4, the data is read correctly as 100. Substrate states S10 and S12 provide some added noise margin, since the correct data is written to state S11, but when the number of electrons in the depletion layer of cell changes such as due to noise, the correct binary data is still read from additional substrate states S10, S11, or S12.

FIG. 3B shows the flash memory reference voltage levels when the memory cell is programmed for MLC. MLC has two binary bits and a total of four states, 00, 01, 10, 11. The weak page data bit is assumed to be constant, such as 1.

Since there are only four logic states in MLC mode, wider noise margins are available for more reliable reading. When the data to be programmed is 10, the programming pulses are applied until the cell's voltage is in substrate state S8, between lower limit voltage IL2 and upper limit voltage IU2. During a subsequent read, if the voltage read is between voltages IL3 and IL1, the data is read correctly as 10. Substrate states S10, S9 and S7, S6, S5 provide some added noise margin, since the correct data is written to state S8, but may be read from any of 6 substrate states S10 to S5. This MLC mode can be mimicked dynamically by performing a level-bit L2:L0 algorithm in the flash chip, when the L2:L0 values (010, 110) indicate the weakest page is not programmed.

FIG. 3C shows the flash memory reference voltage levels when the memory cell is programmed for SLC. SLC has only one binary bits and a total of two states, 0, 1. The weak page and middle page data bits are assumed to be constant, such as 11.

Since there are only two logic states in SLC mode, much wider noise margins are available for reliable reading. When the data to be programmed is 0, the programming pulses are applied until the cell's voltage is in substrate state S2, between lower limit voltage IL0 and upper limit voltage IU0. During a subsequent read, if the voltage read is between voltages IL2 and ground, the data is read correctly as 0. Substrate states S7, S6, S5, S4, S3 and S1 provide much added noise margin, since the correct data is written to state S2, but may be read from any of 7 substrate states S7 to S1. This SLC mode can be performed by a level-bit L2:L0 algorithm in the flash chip, wherein a L2:L0 value of 100 indicates that only the strongest page is programmed.

The arrows in FIG. 3B-C indicate the reference or limit voltages selected as distinguishing between logic states read. The exact voltage levels selected may be adjusted, such as by programming registers of the truth tables in translation logic 60 as to which substrate levels correspond to which logic states. Also, the exact voltages of the reference and limit voltages all may be adjusted up or down by the reference voltage logic of FIG. 2. Thus there are two ways to adjust the voltage levels that distinguish between logic states. Note that in FIGS. 3B, 3C, the higher voltage logic states have larger noise margins than do the lower voltage logic states. This allows for a similar percentage margin for each voltage level.

FIG. 4 is a truth table for translation logic for a 2-bit MLC. The outputs of comparators 30-40 (FIG. 1) are shown as columns IL0, IU0, IR1, . . . IL3, IU3. These comparator outputs are inputs to translation logic 60 and thus are inputs to the truth table of FIG. 4. The right-most 5 columns (read data D1, D0, in-range, over-program and under-program) are the outputs produced by the truth table and by translation logic 60, which implements this truth table.

The selected flash cell 54 (FIG. 1) stores 2 binary bits in 4 levels. These in-range levels correspond to read substrate sub-states 2, 5, 8, 11 and produce data outputs D1, D0 of 11, 10, 01, 00, respectively. The read in-range output is activated when the bit-line voltage is between upper and lower voltage references for that state, such as between VL0 and VU0. The IL0 comparator (30 in FIG. 1) outputs a 0 while the IU0 comparator (31 in FIG. 1) outputs a 1 in sub-state 2. Other comparators 32-40 also output a 1, as shown in row 2 of the table.

When the bit-line voltage is not between the upper and lower references for a state, the in-range signal is not activated and is a 0. Instead, one of the over- or under-program signals is activated. For example, when the bit-line voltage is between VL0 and VR1, (row 3), the over-program signal is activated. The bit-line voltage is a little too high. The correct data is still output as D1, D0 for a read, but the noise margin is violated. A further shift in programmed charge can cause the wrong data values to be read next time. Action can be taken to relocate the data to a new block. During programming, the under- and over-program signals can be used to determine when to halt programming to get the flash cell to the ideal charge.

The switching level (SW LVL) column shows the first comparator with a 1 output. This is the comparator for the lowest reference or limit voltage that exceeds the actual substrate voltage read from the bit line. For substrate state S5, the first level with a 1 is IU1, so IU1 is the switching level for state S5. This shorthand notation of the switching level is used for the more complex examples shown in FIGS. 5-11 to reduce the size of the truth tables. FIGS. 5-11 show truth tables for TLC that have 24 substrate states, while FIG. 4 shows a truth table for MLC having only 12 substrate states.

FIG. 5 is a truth table for a TLC flash chip reading a page in SLC mode. In SLC mode, the paired weak and middle pages were not programmed with valid data, so level bits L1, L0 remain 0, while only L2 is a 1. The lower two data read bits D1, D0 are invalid and ignored. Only upper data bit D2 is read. D2 is read as a 1 for substrate states S1-S6 and read as a 0 for states S7-S24. The voltages for the S6, S7 levels that distinguish between logic 0 and logic 1 can be programmed with registers to be moved up and down in voltage. The read in-range, over- and under-programming signals are ignored for a read operation.

FIG. 6 is a truth table for a TLC flash chip reading a page in MLC mode. In MLC mode, the paired weak page was not programmed with valid data, so level bit L0 remains 0, while both L2 and L1 are ones. The lowest data read bit D0 is invalid and ignored. Only upper data bits D2 and D1 are read. D2, D1 are read as 11 for substrate states S1-S3, read as a 10 for states S4-S10, read as 01 for states S11-S16, and read as 00 for states S17-S24. The voltage levels that divide logic states 00/01/10/11 can be programmed with registers to move the voltage boundaries up and down.

FIG. 7 is a truth table for a TLC flash chip reading a page in TLC mode. In TLC mode, all paired three pages were programmed with valid data, so all three level bits L2, L1, L0 are ones. All three data bits D2, D1, D0 are read. D2, D1, D0 are read as 111 for substrate states S1-S3, read as a 110 for states S4-S6, read as 101 for states S7-S9, etc. In this case, there is no improvement for the L2:L0 algorithm.

FIG. 8 shows the state of a memory cell after block erase. No data has yet been programmed into the flash cell, so level bits L2, L1, L0 are all 0. The bit line voltage is in a low state such as S2, but could be in some other substrate state due to trapped electrons in the gate area. The level bits are stored in the overhead area for a flash block or in a special flash page, and thus the level bits are erased with the block. If the level bits are stored in a DRAM or are cached, then the level bits would be cleared in the DRAM when the power is off.

FIG. 9 shows the TLC flash cell being programmed in SLC mode. Level bit L2 is programmed to a 1 while level bits L1, L0 remain 0. These level bits may be stored in the overhead of the flash page as meta data. The target state for writing D2=1 is substrate state S2, while the target state for writing D2=0 is substrate state S14. These states are reached by successively applying a programming pulse and then reading the bit line voltage. The substrate level is determined and more programming pulses are applied until the correct target substrate state is reached.

FIG. 10 shows the TLC flash cell being programmed in MLC mode. Level bits L2, L1 are programmed to a 1 while level bit L0 remains a 0. The target state for writing D2, D1 as 11 is substrate state S2, for writing D2, D1 as 10 is substrate state S8, for writing 01 is substrate state S14, and for 00 is S20. These states are reached by successively applying a programming pulse and then reading the bit line voltage. The substrate level is determined and more programming pulses are applied until the correct target substrate state is reached.

FIG. 11 shows the TLC flash cell being programmed in TLC mode. All three level bits L2, L1, L1 are programmed to a 1. The target state for writing D2, D1, D0 as 111 is substrate state S2, for writing 110 is substrate state S5, for writing 101 is substrate state S8, etc. These states are reached by successively applying a programming pulse and then reading the bit line voltage. The substrate level is determined and more programming pulses are applied until the correct target substrate state is reached. Alternately, programming pulses are applied until the correct data is read, and then the over, under, and in-range signals are examined and further programming pulses applied until the in-range signal is active.

Figure 12:
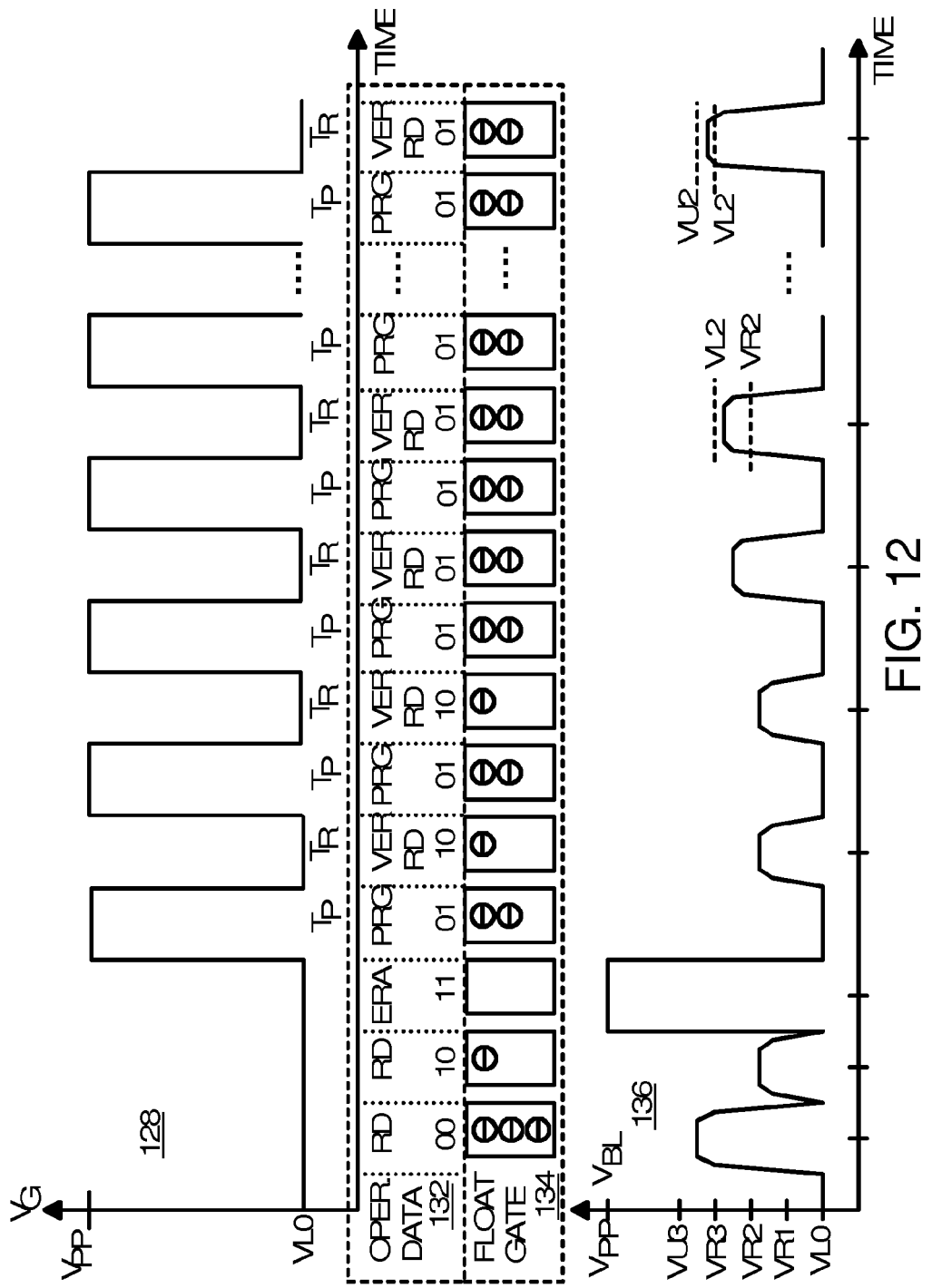
FIG. 12 illustrates a sequence of read, erase, programming, and read-verify cycles.

FIG. 12 illustrates a sequence of read, erase, programming, and read-verify cycles. Upper graph 128 shows the gate voltage of a selected flash memory cell over time, while lower graph 136 shows the bit-line voltage of a selected flash memory cell over time. The selected bit-line voltage is similar to the voltages on the sensing-node and the drain of the selected flash cell transistor.

Operations 132 shown along the x-axis are a sequence of operations starting with a read of flash cell, an erase, and then a series of programming and read-verify operation pairs. The negative charge on the selected flash cell's floating gate (electrons) are shown after each operation as floating gate charge 134.

The first operation is a read of a cell in the fully-programmed, 00 state. The floating gate has the most negative charge, so when read voltage VL0 is applied to the control gate in upper graph 128, the resulting bit-line and sensing-node voltage in lower graph 136 is above reference voltage VR3 (IR3 FIG. 7), but below upper-limit voltage VU3 (IU3, FIG. 7). From FIG. 7, this substrate voltage IL3 is read as state 00.

The second operation is a read of a cell in the partially-erased state 10. This cell has less negative charge on its floating gate, and produces a larger read current, pulling the bit-line and sensing node to a lower voltage. When read voltage VL0 is applied to the control gate in upper graph 128, the resulting sensing-node voltage in lower graph 136 is between reference voltages VR1 and VR2. From FIG. 7, this sensing voltage is read as state 10.

The selected cell is next erased in the third operation. Programming voltage Vpp is applied to the drain through the bit-line. The sensing node itself may be disconnected from the bit-line when Vpp is applied to protect the sense amplifier. The voltage VL0, or ground, is applied to the control gate of the selected flash cell. Negative charge is removed from the floating gate during the erase. Many cells can be erased in parallel using a flash-erase operation.

The erased cell is programmed in the fourth operation. The write data to program into the cell is 0. The programming voltage Vpp is applied to the control gate for a programming time period Tp, while the bit-line is kept at a low voltage such as ground or VL0. Charge is injected into the floating gate during programming.

A read-verify operation is performed immediately after the programming operation, on-the-fly. The control gate voltage is dropped from Vpp to the normal read voltage VL0, and the bit-line is pulled up by the bias transistor until it balances pull-down current from the flash cell. The sensing-node voltage is between VR1 and VR2, which is state 10. Since the data in the write cache is 01, the data mis-matches and the read-verify fails. The control engine performs another programming operation to try to increase the charge in the floating gate to reach state 01.

Programming is repeated by raising the control-gate voltage to Vpp for a further time Tp, or some other time period, while the bit-line is grounded or set at VL0. Then another read-verify is performed by lowering the gate voltage to VL0 and activating the bit-line bias and connecting the bit line to the sense amplifier. The sensing-node voltage may have risen somewhat, but again falls between VR1 and VR2, state 10. The data again mis-matches.

A third programming operation is performed on the flash cell. During the read-verify operation that follows, the sensing voltage has risen and is now between VR2 and VR3. This is the intended state 01. The write-cache data matches the read-verify data. However, the substrate sensing voltage is not between the target limits VL2 and VU2. Instead, the sensing voltage is between VR2 and VL2. The flash cell is still under-programmed, so the under-program signal is set.

The control engine performs another programming operation to try to increase the charge in the floating gate to reach the middle of state 01, between target limits VL2 and VU2. During the read-verify operation that follows, the sensing voltage has risen and is now between VR2 and VR3. This is the intended state 01. The write-cache data matches the read-verify data. However, the sensing voltage is still not between the target limits VL2 and VU2. Instead, the sensing voltage is between VR2 and VL2. The flash cell is still under-programmed, so the under-program signal is again set.

Pairs of programming and read-verify operations can continue until the sensing voltage finally falls within the target limits VL2 and VU2. The final programming operation causes the sensing voltage to fall between target limits VL2 and VU2 during the last read-verify operation. Then the in-range signal is set, and the correct data is read, ending the series of programming and verify operations.

If the programming were to over-shoot the target range, an error would be signaled. Thus the programming time Tp may be decreased when nearing the target range, such as when the data matches. In some embodiments, a register is added to adjust the Tp width of upper graph 128 to increase or decrease the pulse width compared with the default pulse width. Also, a register may be added to increase or decrease the programming voltage Vpp compared to a default Vpp value. The enterprise MLC (eMLC) decreases Tp width and decreases the Vpp voltage to achieve slower program and erase times. This results in increased P/E cycles (less endurance) and decreased retention time (3 months). In this invention, the opposite is done, by increasing Tp, the pulse width, and increasing the Vpp voltage, which results in faster program and erase times. The number of specified P/E cycles decreases but retention time is increased.

FIG. 13 is a block diagram of a flash endurance controller for controlling flash chips in mixed SLC/MLC/TLC modes. Endurance controller 192 has host interface 16, which communicates with a host or a PCIe RAID controller 19 using a bus such as a PCIe, SATA, or Universal-Serial-Bus (USB), NVMe, Thunderbolt, eMMC, iSSD, etc. Host or PCIe data from host interface 16 is sent to other blocks in controller 192. In the case of PCIe RAID controller 19, SSD 192 and HDD 21 are part of the PCIe RAID system.

Endurance Controller Endurance Translation Logic (ETL) DRAM buffer 194 may store backups of host caches and ramdisks, and other data or tables flushed from the host. It may also store other data including meta-data, spare and swap blocks, tables for bad page management, and other buffers and tables. ETL DRAM buffer 194 may also store security information, tables, firmware, mapping tables, bad block/erase count tables, page status tables, the file system for the SSD, and various other tables and buffers. Some areas of flash memory 124 may be reserved for bad blocks substitution, refresh substitutions, or for over-provisioning.

DRAM interface 12 reads and writes data in ETL DRAM buffer 194 while multi-channel flash interface 14 reads pages, programs data pages, and erases blocks in flash memory 124, which may be organized into several channels. Native Command Queue (NCQ) manager 152 may re-order host commands from the host and manage a queue of host commands received through host interface 16. The manager loads host commands into a command queue where writes are re-ordered and combined to reduce flash writes.

RAID controller 150 writes new data across several channels of flash memory 124 and may replicate data to provide redundancy and data recovery. ECC manager 144 generates error-correction code (ECC) to attach to write data, and compares stored ECC to re-generated ECC to detect and correct errors on reads. It also manages pages of flash that need extra ECC protection, generating ECC for those pages, and managing storage and retrieval of the ECC data when needed. Instead of performing EC, ECC manager 144 can be used for LDPC. Bad page manager 206 keeps track of all locations of page status in flash memory 124. This can extend the lifetime of individual blocks, since only one page may be bad in the block, and other pages may continue to be used. More complex bad-block management may reduce the overall wear of the flash drive.

Page grouping manager 57 groups together pages or partial pages to increase packing efficiency. Writes to flash memory 124 may be reduced through such grouping. Temp manager 153 can handle temporary files, such as by diverting them to ETL DRAM buffer 194 and preventing them from being written to flash memory 124.

Wear-leveler 140 may provide two methods of wear leveling methods. One method is to dynamically choose the lowest wear leveling count block from the available empty blocks to write data to. The other method is based on a wear leveling count threshold. Once this threshold is reached, blocks of flash data are moved from one physical block (with a low wear leveling count) to another empty physical block (with a high wear leveling count) in flash memory 124. Updates are made to the logical-to-physical mapping in mapping tables that are managed by table manager 148. Table manager 148 also tracks the type of data that is stored in each logical block or page so that temp files, paging files, FAT, FDB, and user data files are tracked once identified and categorized by data split manager 204. Alternatively, the host can pass the data type information through vendor commands to the SSD. Alternately, this function can be optionally disabled for certain situations.

Encryption engine 146 performs encryption of write data and decrypts read data. TRIM manager 142 processes a TRIM command from the file system or OS on the host. The TRIM command indicates that a sector is no longer needed by the host and can be wiped or erased. The trimmed page is marked in the page status table as a garbage page as '100b' or '101b'. When doing background garbage collection, if that block is identified as an erase candidate, this page is not be copied to a new block. At that time the TRIM command is completed. TRIM manager 142 performs overhead such as keeping track of which sectors and pages in a block are no longer needed. A garbage collector may also be used to track blocks that are ready for erasing. Once an entire block is no longer needed, TRIM manager 142 activates the garbage collector or other erase mechanism to erased the block so that the block may be re-used.

S.M.A.R.T. function 139 processes S.M.A.R.T. commands or vendor commands from the host, such as to monitor and control error correction, wear, bad block, and other flash memory management. S.M.A.R.T. stands for Self-Monitoring, Analysis and Reporting Technology. The host can use the S.M.A.R.T. command sets to monitor some important data from the SSD device such as power on time, wear-leveling count, etc. The Host can use this data to diagnoses and identify the life expectancy of the SSD. It can also use the information to determine the warranty coverage based on the usage. The host can replace the SSD drive before it experiences a real casualty. In RAID, the host can use S.M.A.R.T. commands to avoid a more expensive RAID 5 configuration.

Transaction handler 211 ensures that data is completely written or transferred to the flash. Over-provisioning 208 sets aside and manages spare blocks in flash memory 124. Security 215 may perform a password verification process before allowing access to the secure partition of flash memory 124. The partition can be the whole drive or a part of the drive. Refresh manager 202 may periodically (such as daily or weekly) refresh data in flash memory 124 if the data had been written for a period that met the criteria of being in danger of data loss. Secure erase manager 18 performs a higher-security erase operation such as writing all zeros or all ones to a block to remove data when required.

Power backup 195 provides backup power so that endurance controller 192 may write data from ETL DRAM buffer 194 to flash memory 124 when power fails.

The whole contents of flash memory 124 may also be flushed to hard disk, such as to local HDD 23 by HDD interface 15, or to HDD 21 through PCIe RAID controller 19.

Figure 28:
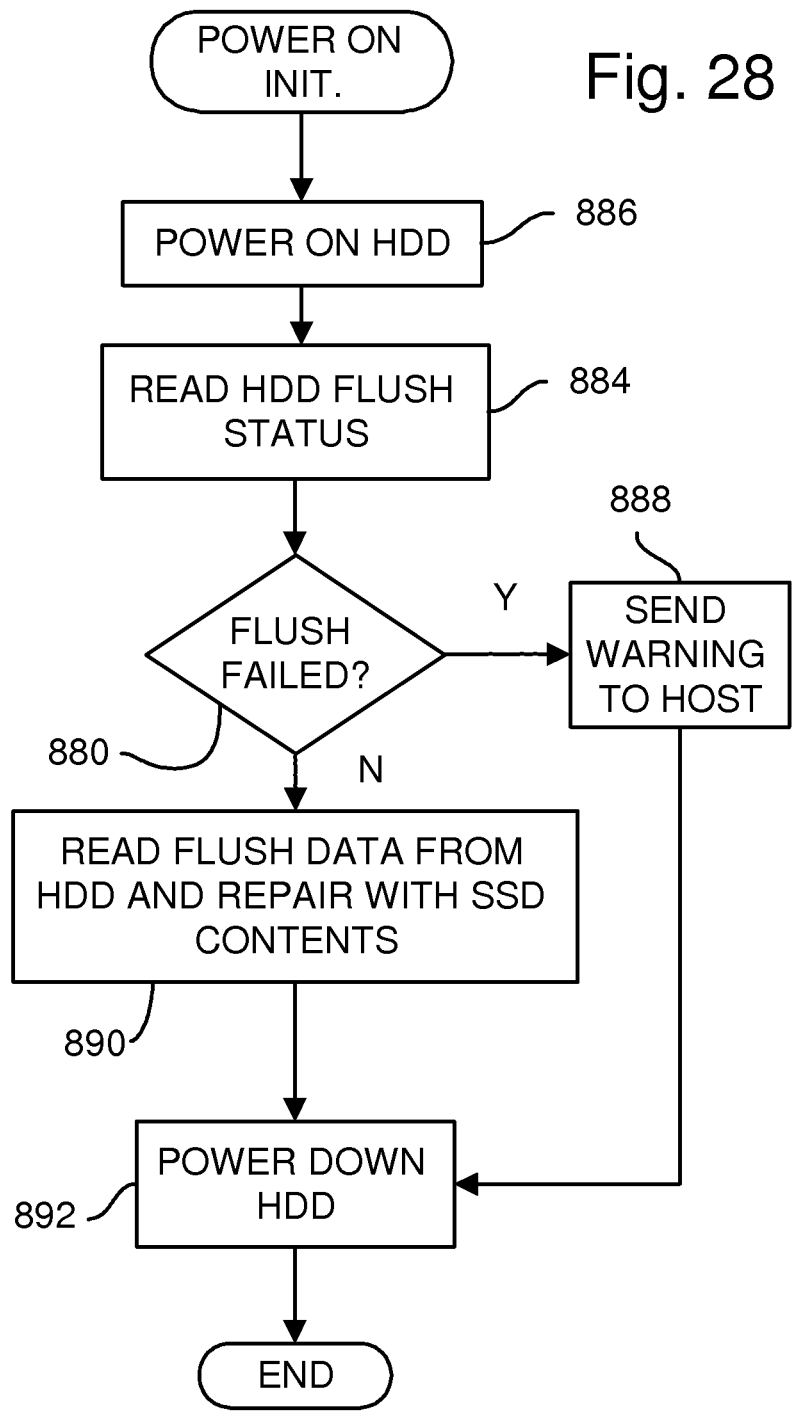
FIG. 28 is a process for restoring flushed flash data from a directly controlled HDD.
Figure 29:
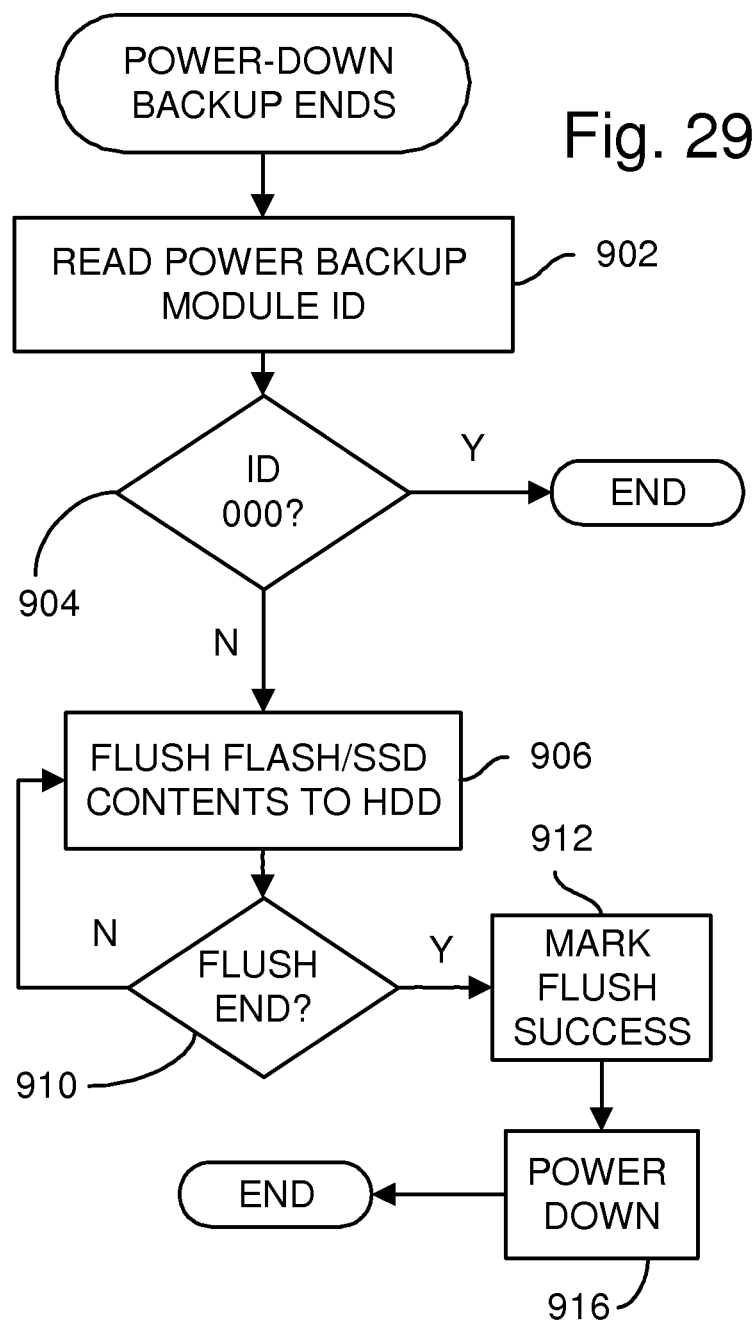
FIG. 29 is a process for flushing flash data to a HDD through a PCIe controller or host.
Figure 30:
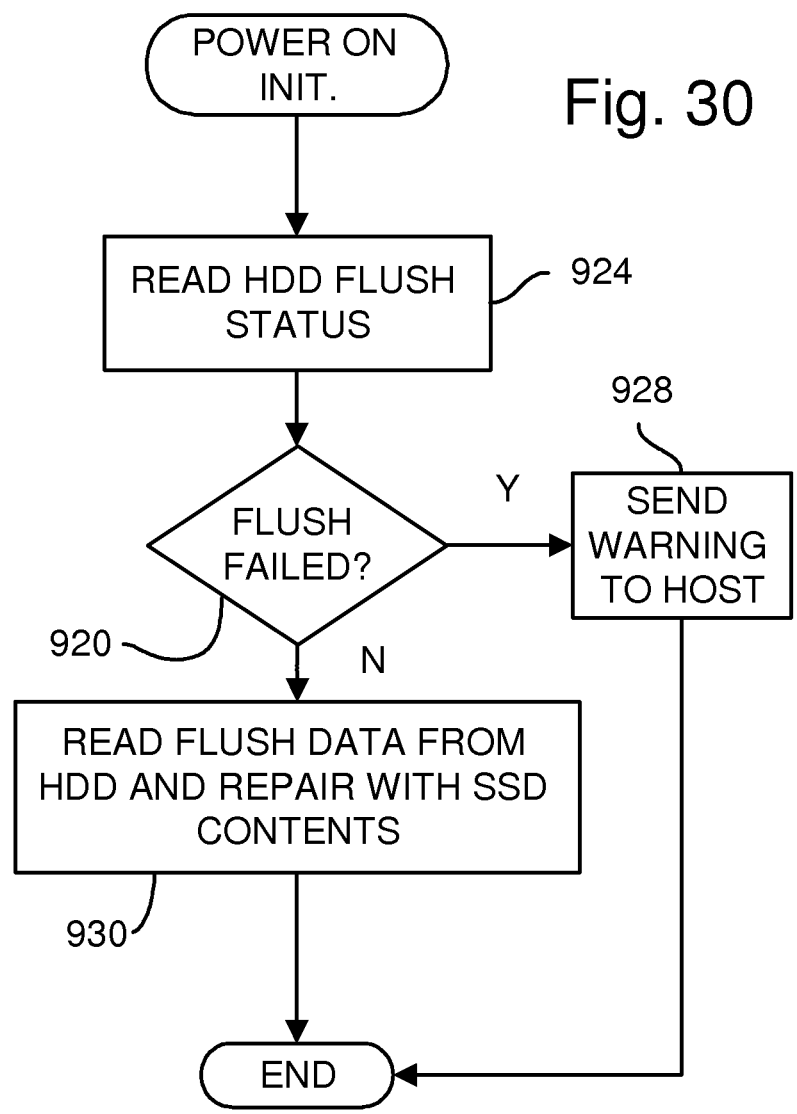
FIG. 30 is a process for restoring flushed flash data from a HDD through a PCIe controller or host.

The HDDs provide a method to solve the retention problem especially for the TLC (with data retention of about 3 months). In case the device is powered off for more than three months and there is no backup power for more than three months, the flash contents are stored in HDD to protect against loss of data due to the poor retention. FIGS. 28-30 further describe the operations.

FIG. 14A-C highlight configurations of blocks of flash memory that include mixed modes of retention-MLC (RT-MLC). In this example, all flash memory chips are retention MLC chips, which have a higher retention than a standard MLC flash chip. A RT-MLC has a higher retention but a lower endurance, as measured by the specified number of program-erase cycles.

FIG. 14A shows a flash memory configured as RT-MLC. There are four channels of flash memory chips and four chip-enables per channel, but other arrangements are possible.

Density is high since all blocks in flash memory 124 are written as MLC. The RT-MLC blocks are specified to have 1,000 program-erase cycles and a retention of 12 months before cell leakage results in read errors.

In FIG. 14B, flash memory 124 has all RT-MLC blocks configured as RT-SLC. Density is half of that for the configuration in FIG. 14A, since RT-SLC blocks (1-bit) store about half as much data as RT-MLC blocks (2-bits). Since RT-SLC blocks use the strong pages and not the weak pages, the specified endurance is increased to 10,000 program-erase cycles and the retention is increased to 120 months, both about 10× of RT-MLC.

In FIG. 14C, flash memory 124 has a mixed configuration of 25% of the RT-MLC blocks configured as RT-SLC blocks, with the remaining 75% of the blocks configured as RT-MLC blocks. The density is only about 12.5% less than FIG. 14A. The overall net endurance and retention are also intermediate, at 3250 program-erase cycles and 39 months. Thus density, endurance, and retention may be traded off by the configuration of flash memory 124.

FIG. 15 shows bad block/erase count tables and page status tables that store assigned-level bits. Bad block/erase count table 471 has entries for blocks of flash memory. Each entry contains a block status field, with 3 bits that indicate if the block is empty (erased), used, a block with some garbage pages, a whole bad block, or a partially bad block with some bad pages and some good pages.

Each block entry also has a 19-bit erase count and an 8-bit write date (or week, month). The 19-bit erase count starts at 0 when the device is first produced. Every time the block is erased it increments by one. This erase count can be used for wear leveling control and can be analyze by the S.M.A.R.T. for checking the health condition of the device. The write date is the date that the first write to the block occurred (from the block erased state), in weeks. It is used for determining when to perform refresh. For TLC devices the retention time may be less than 1 year. The write date may be encoded data (MM-DD-YY), or any kind of number value that the firmware of the device controller can manage.

Assigned-level bits are used in the block's entry in bad block/erase count table 471. In this embodiment, each whole block is configured as either TLC, MLC, or SLC. Firmware examines these two bits and will not write to the weakest and middle pages if the block is assigned as SLC. Firmware will not write to weakest page if the block is assigned as MLC. In another embodiment, through firmware control, when the weakest page is set as a bad page in page status table 473 with status '110', the individual cell can be used as MLC. If the weakest and middle pages as set as bad pages, the individual cell can be used as SLC. Status '110' is for using the page as SLC. Firmware will not reuse a bad page with status '111'.

Page status table 473 has entries for all pages in a block. Each page has a 3-bit page status field. Since each page entry is only 3 bits long, many page entries may be packed together. The page status indicates an empty, used, or garbage page, a bad page, or a page that is protected with a higher level of error correction, such as a longer ECC code than for other pages. Bad pages can be further identified as being bad for TLC or MLC use, but good for SLC use, (status 110), or bad for any of SLC, MLC, TLC (status 111). Firmware may read the level bits and program only the strong pages for status 110.

Figure 16A:
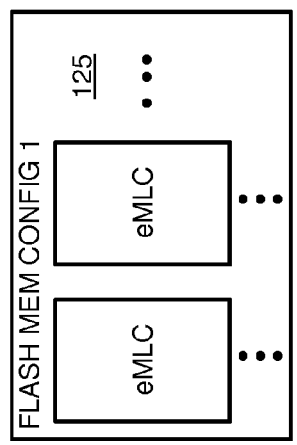
FIGS. 16A-C show mixed flash-memory configurations for eMLC devices.
Figure 16B:
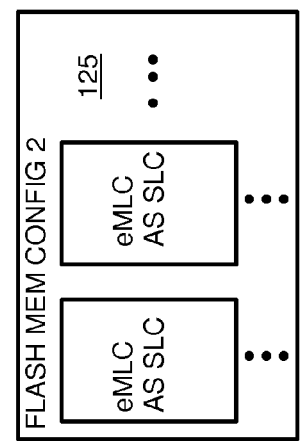
Figure 16C:
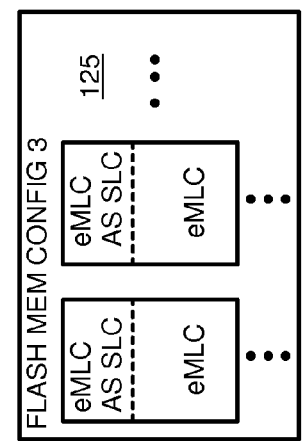

FIGS. 16A-C show mixed flash-memory configurations for eMLC devices. Another kind of flash memory chips is known as an enterprise MLC (eMLC) chip. Compared with RT-MLC chips, eMLC chips have a much better endurance (30,000 cycles vs. 1,000 cycles for RT-MLC), but a much lower retention time (3 months vs. 12 months for RT-MLC). Flash memory 125 may be arrayed into multi-chip channels such as four channels of four chips each, as shown in FIG. 14. FIG. 16A shows a 100% eMLC configuration for flash memory 125, which has eMLC endurance (30K cycles) and retention (3 months). A refresh of data, such as moving a block (reading, erasing, and writing), is required every 3 months.

In FIG. 16B, flash memory 125 is configured as eMLC as SLC. Endurance has increased to 300K cycles and retention has increased to 36 months, but density is halved.

FIG. 16C shows a mixed configuration with 25% eMLC as SLC, and 75% eMLC. Density is reduced by about 12.5% while average endurance and retention are intermediate, at 97,500 cycles and 11.25 months. The eMLC as SLC blocks have a high endurance of 300,000 cycles and 36 months retention, while the eMLC blocks have an endurance of 30,000 cycles and a retention of 3 months. However, the average endurance and retention are intermediate values.

Figure 17A:
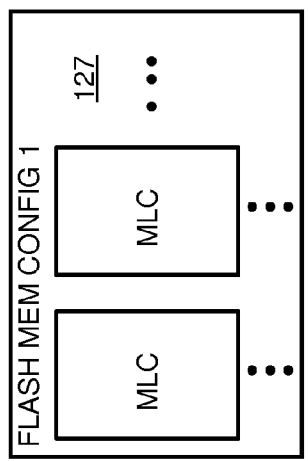
FIGS. 17A-C show mixed flash-memory configurations for standard MLC devices.
Figure 17B:
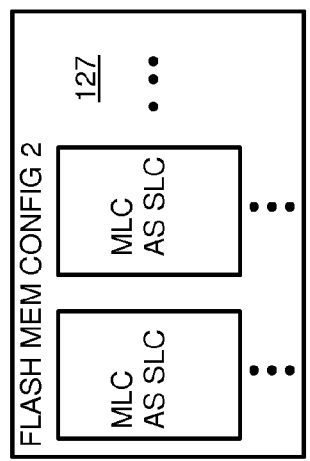
Figure 17C:
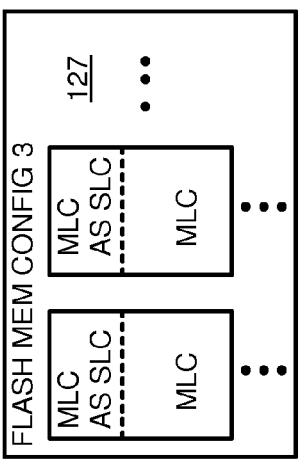

FIGS. 17A-C show mixed flash-memory configurations for standard MLC devices. Compared with RT-MLC chips, MLC chips have a better endurance (3,000 cycles vs. 1,000 cycles for RT-MLC), but the same retention time (12 months). Flash memory 127 may be arrayed into multi-chip channels such as four channels of four chips each, as shown in FIG. 14

FIG. 17A shows a 100% MLC configuration for flash memory 127, which has MLC endurance (3K cycles) and retention (12 months). A refresh of data is required every 12 months.

In FIG. 17B, flash memory 127 is configured as MLC as SLC. Endurance has increased to 100K cycles and retention has increased to 120 months, but density is halved.

FIG. 17C shows a mixed configuration with 25% MLC as SLC, and 75% MLC. Density is reduced by about 12.5% while average endurance and retention are intermediate, at 27,250 cycles and 39 months. The MLC as SLC blocks have a high endurance of 100,000 cycles and 120 months retention, while the MLC blocks have an endurance of 3,000 cycles and a retention of 12 months.

FIGS. 18A-F show mixed flash-memory configurations for TLC devices. TLC flash memory chips have blocks that may be configured as TLC, as TLC as MLC, or as TLC as SLC. TLC has a much higher density than MLC, but much lower endurance and about the same retention as RT-MLC, but better retention than eMLC. Flash memory 129 may be arrayed into multi-chip channels such as four channels of four chips each, as shown in FIG. 14.

Figure 18A:
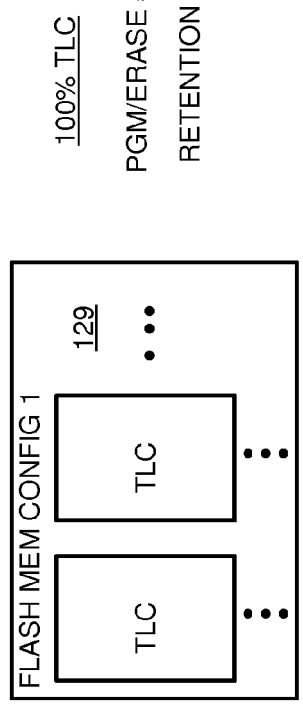

FIG. 18A shows a 100% TLC configuration for flash memory 129, which has TLC endurance (only 500 cycles) and retention (12 months). A refresh of data is required every 12 months but blocks may be written only about 500 times before the block becomes bad.

Figure 18B:
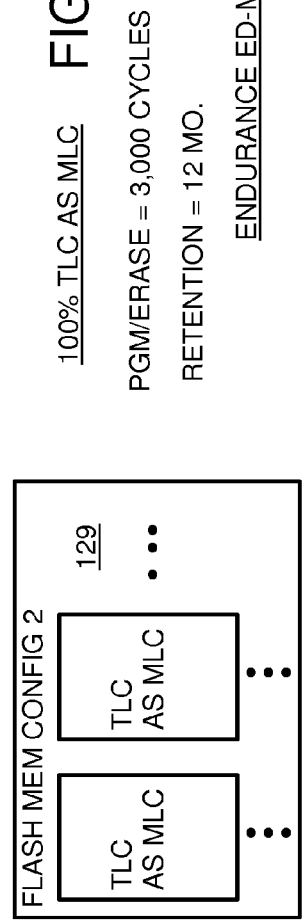

In FIG. 18B, flash memory 129 is configured as TLC as MLC. Endurance has increased to 3,000 cycles and retention remains at 120 months, but density is two thirds. This is an endurance-MLC (ED-MLC) configuration of TLC, since it has about the same endurance and retention as MLC (FIG. 17B).

Figure 18C:
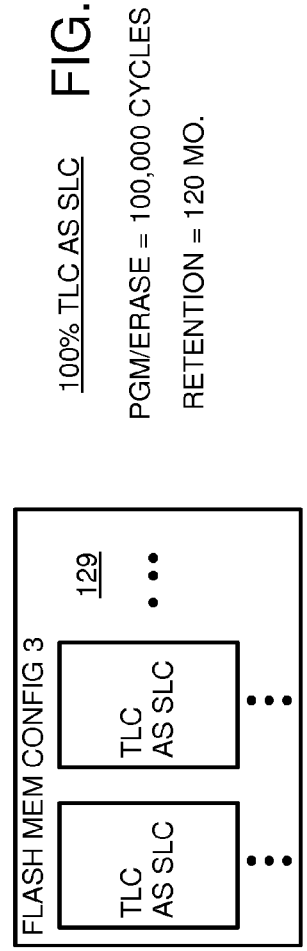

In FIG. 18C, flash memory 129 is configured as TLC as SLC. Endurance has increased to 100,000 cycles and retention increased to 120 months, but density is one-third of TLC.

FIG. 18D shows a mixed configuration with 25% TLC as MLC, and 75% TLC. Density is reduced by about 8.3% from TLC while average endurance and retention are somewhat better, at 1,125 cycles and 12 months. The TLC as MLC blocks have a high endurance of 3,000 cycles and 12 months retention, while the TLC blocks have a low endurance of 500 cycles and a retention of 12 months.

FIG. 18E shows a mixed configuration with 25% TLC as SLC, 25% TLC as MLC, and 50% TLC as MLC. Density is reduced by about 25% from TLC while average endurance and retention are intermediate, at 26,000 cycles and 39 months.

FIG. 18F shows a mixed configuration with 25% TLC as SLC, and 75% TLC as MLC. Density is reduced by about 41.7% from TLC while average endurance and retention are intermediate, at 27,250 cycles and 39 months. The TLC as SLC blocks have a high endurance of 100,000 cycles and 120 months retention, while the TLC as MLC blocks have an endurance of 3,000 cycles and a retention of 12 months.

Figure 19A:
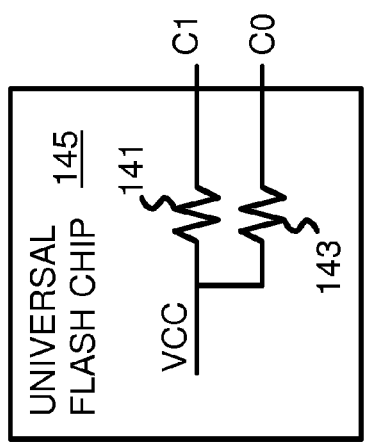
FIGS. 19A-B show external pins for configuring a TLC chip as single usage TLC, MLC, and SLC modes.
Figure 19B:
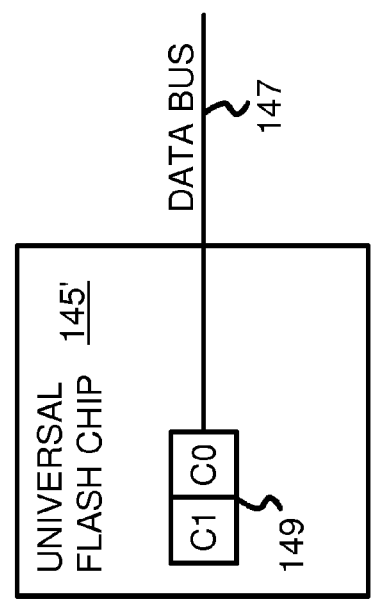

FIGS. 19A-B show external pins for configuring a TLC flash chip in TLC, MLC, or SLC modes. External pins C1, C0 are used to indicate the mode to the flash memory chip, such as to flash memory 124. The same TLC chip may be used as a TLC, MLC, or SLC chip. Universal flash chip 145 is a flash memory chip that reads external pins C1, C0 to indicate the type of flash memory being used. Pins C1, C0 may be connected to power or to ground on the circuit board (not shown). Internal resistors 141, 143 connect to power to pull up C1, C0 when there is no external connection so that TLC mode is used by default.

For example, C1, C0 of 11 indicates TLC, 10 indicates MLC, and 0X indicates SLC. This is a hardware-based method to configure the whole chip to one of the three modes. Alternatively, FIG. 19B shows that data bus 147 may write C1, C0 to programmable registers in universal flash chip 145' as serial data to be stored in registers 149 in universal flash chip 145'.

SLC, MLC, and TLC modes use the same physical flash cells. TLC needs the most support circuits (such as shown for 1 bit in FIG. 1) to read the many voltage levels from the cell. The cost and physical size of TLC should be more than one third of SLC and MLC should be more than half of SLC. In reality, due to market demand factors, in the current market with equivalent size of memory cells, 2 GB MLC is around 10% more expensive than 3 GB TLC, and 1 GB SLC is almost three times the price of 3 GB TLC. With this invention, a TLC chip design manufactured by a vendor may be used to replace different designs of more expensive SLC and MLC chips. The consumer may benefit by, lower prices on SLC and MLC chips.

A multi-bit flash TLC chip may also be used as only one bit per cell (SLC) with outside hardware pins (FIG. 19A) or using firmware programmed registers (FIG. 19B). Once the TLC chip is hardwired or firmware programmed to MLC or SLC mode, the TLC chip cannot used as TLC, unless the mode is changed by the hardwired control or by a firmware program. Alternatively, Instead of the whole chip being configured to SLC/MLC/TLC/QLC/ . . . , when combined with those feature described for FIGS. 1 to 18, a multi-bit cell flash chip such as TLC can be used in a mixed mode combination to achieve larger endurance and retention at the expense of size reduction.

Once the whole chip is configured to its dedicated mode, the page numbers can be automatically adjusted. For example, TLC has 0-277 for the page numbers. In MLC mode. the chip automatically hides all the weak pages and shows only pages 0-191 for the page numbers. In SLC mode the chip shows only 0-95 for the page numbers.

Figure 20B:
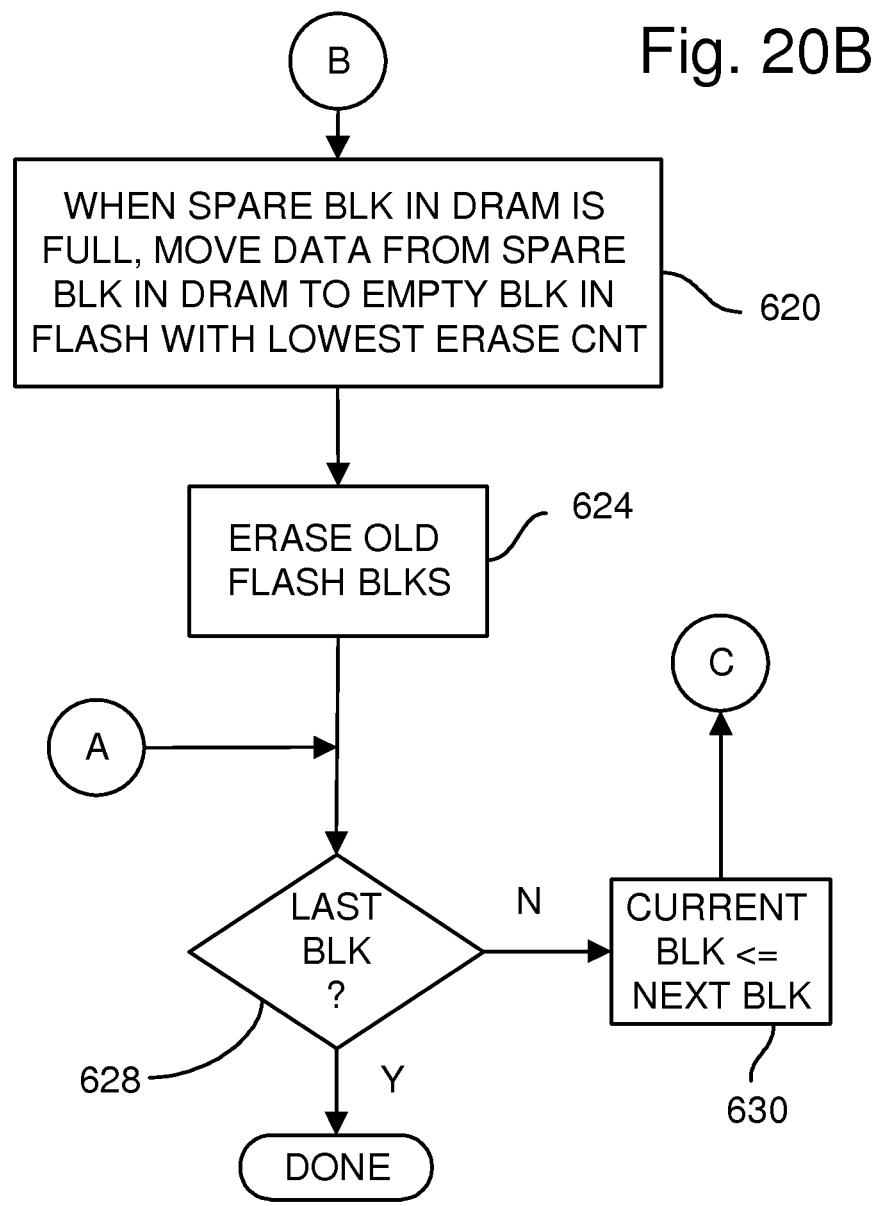

FIGS. 20A-B show a flash block refresh operation using the tables in FIG. 15. When refresh is initiated, such as periodically (once per week, etc.), the current week is obtained, step 602. Whole physical blocks of the flash chips need to be examined for possible retention problems. The current block is set to the first block, step 604, and if the block is not a bad block, step 608, then the block erase count, the block write week, and the block assigned-level (AL bits) are read from the bad block erase count table 471, step 610. The number of weeks since the last write is calculated, such as by subtracting the write date from the current date, step 612. The retention time is also calculated, which can be a variable number in units such as weeks, which can be a function of the erase count, temperature, safety margin, endurance requirement, the assigned-level status such as SLC, etc. The retention time of the flash cell is related to the erase count of the flash block. Each flash vendor has a chart of the relationship of these two parameters. The retention time can be a fixed number in units such as weeks. The retention time can be calculated as a function of the endurance requirement, safety margin, and temperature, etc.

For example, flash memory initially (Program/Erase (P/E) cycles close to 0) has a longer retention time such as 10 years and at a specified P/E endurance such as 3,000 has a shorter retention time such as 1 year. When the P/E is extended over the specified 3,000 P/E times the retention time will be lower than 1 year. For example, if the P/E is 10,000 then the retention time may drop to 1 week. The retention time may be reduced by the erase count as blocks are more worn from many erase cycles. Retention time may be increased by using blocks as SLC only. When the number of weeks since the last write exceeds the retention time, step 614, then all valid pages (based on the page status table 473) in the block are read out and ECC is checked/corrected, then moved to empty pages in a spare block, and packed with other pages from previously refreshed blocks at step 618.

In FIG. 20B, when the spare block in the DRAM is full, data from the spare block in ETL DRAM is moved to a spare block in flash with the lowest erase count, step 620. Then the old flash blocks are erased, step 624. Alternatively, instead of erasing right away, the block can be sent to a garbage collector for erasing later. When there are more blocks to process, step 628, the current block is advanced to the next block, step 630, and the process repeated. This refresh routine prevents data loss in the flash memory cells for certain kinds of flash memory, for example, after power off, enterprise MLC, which has only three months of data retention in a 40 degree C. environment, or consumer grade MLC, which has only one year of data retention in a 30 degree C. environment. Alternately, the write date is page based, and is recorded in page status table 473. Each page can be checked for its write date individually instead of the whole block having the same write date. The refresh will be based on each page's status and uses spare blocks in DRAM to construct a new block in flash memory. In yet another alternative, the refresh routine can create a list of blocks that need be refreshed first and then move the blocks in the list to new spare blocks at the end of refresh routine or at another convenient time.

Figure 21A:
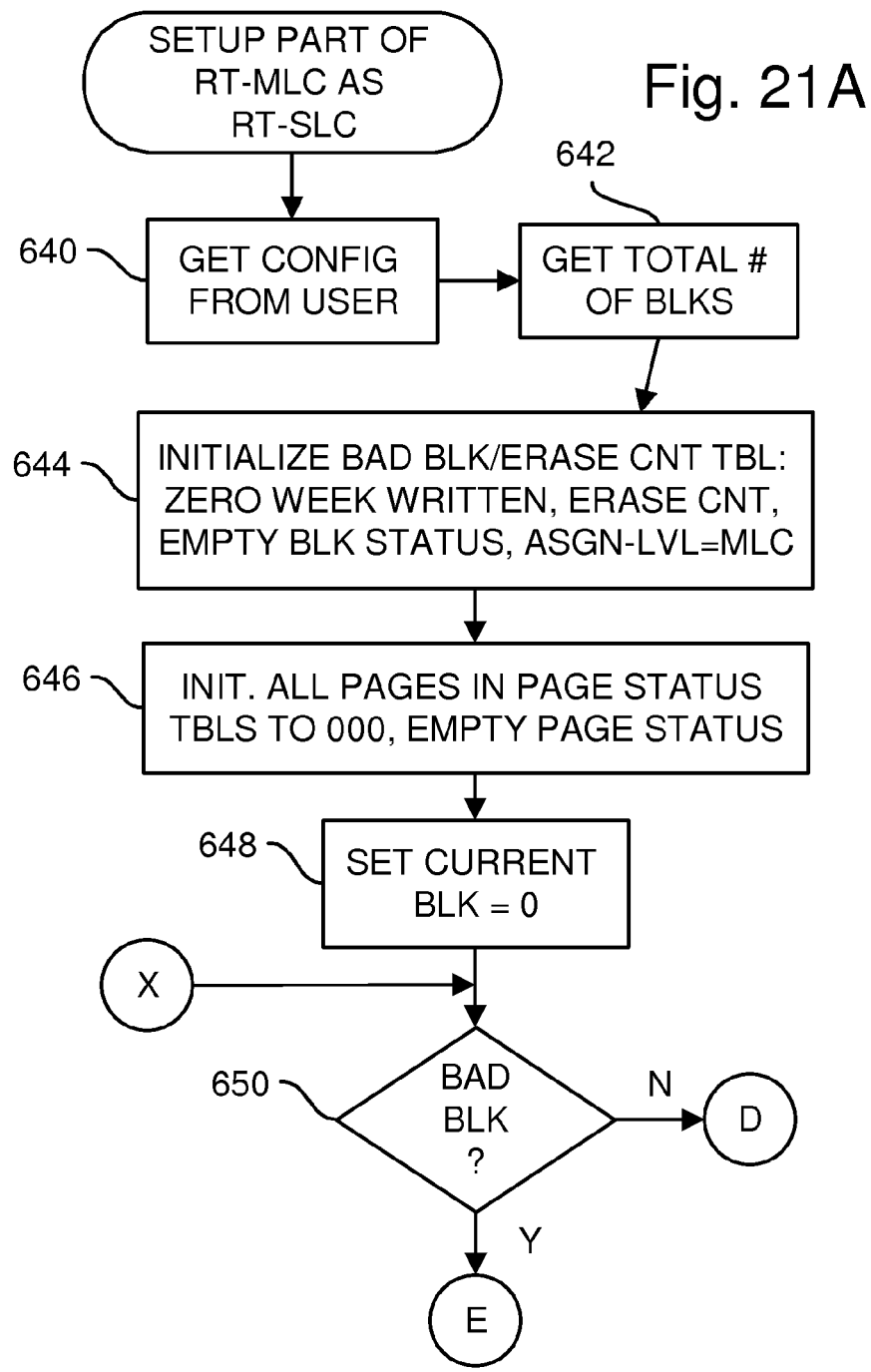

FIGS. 21A-B show a flowchart of setting up a mixed configuration of RT-MLC and RT-SLC blocks. Other kinds of flash such as eMLC, MLC, or TLC could be substituted in this process, with additional steps for mixed TLC configurations.

In FIG. 21A, a desired configuration is obtained from a user or from firmware or another source, step 640. The total number of blocks in the flash memory of the device is obtained, step 642. The bad block/erase count table (471 in FIG. 15) is initialized, step 644, and the erase counts and write week are initialized to zero. The Assigned-Level (AL) bits are set to MLC. The block status is written as an empty block, 000.

All pages in page status table (473 in FIG. 15) are initialized to an empty page status, 000, step 646. The current block is set to the first block, step 648. A list of bad blocks identified by the manufacturer may be consulted. For a flash chip, the original bad blocks from manufacturer may be marked at the first spare byte of the first two pages of that block. By examining a non-zero read out from these two locations, the factory-marked bad blocks are identified. When the block is a factory-marked bad block, step 650, then the block status is written as bad block, 111, step 652, in bad block/erase count table 471. All pages in the block are marked as bad pages, 111, in page status table 473, step 654. The process then repeats to step 650 for the next block, step 561.

When the block is not a bad block, step 650, and the block is the first or second block in the system, step 565, the assigned-level bits for the block in bad block/erase count table 471 are set to SLC mode (11), step 660. The first two blocks hold critical system information so the higher reliability if SLC is preferred for these two blocks. When the target percentage of SLC blocks has not yet been met, step 658, then the assigned-level bits for the block in bad block/erase count table 471 are set to SLC, step 660. Otherwise, the block remains a MLC block. The process repeats to step 650 for the next block until all blocks have been processed, step 651.

Figure 22:
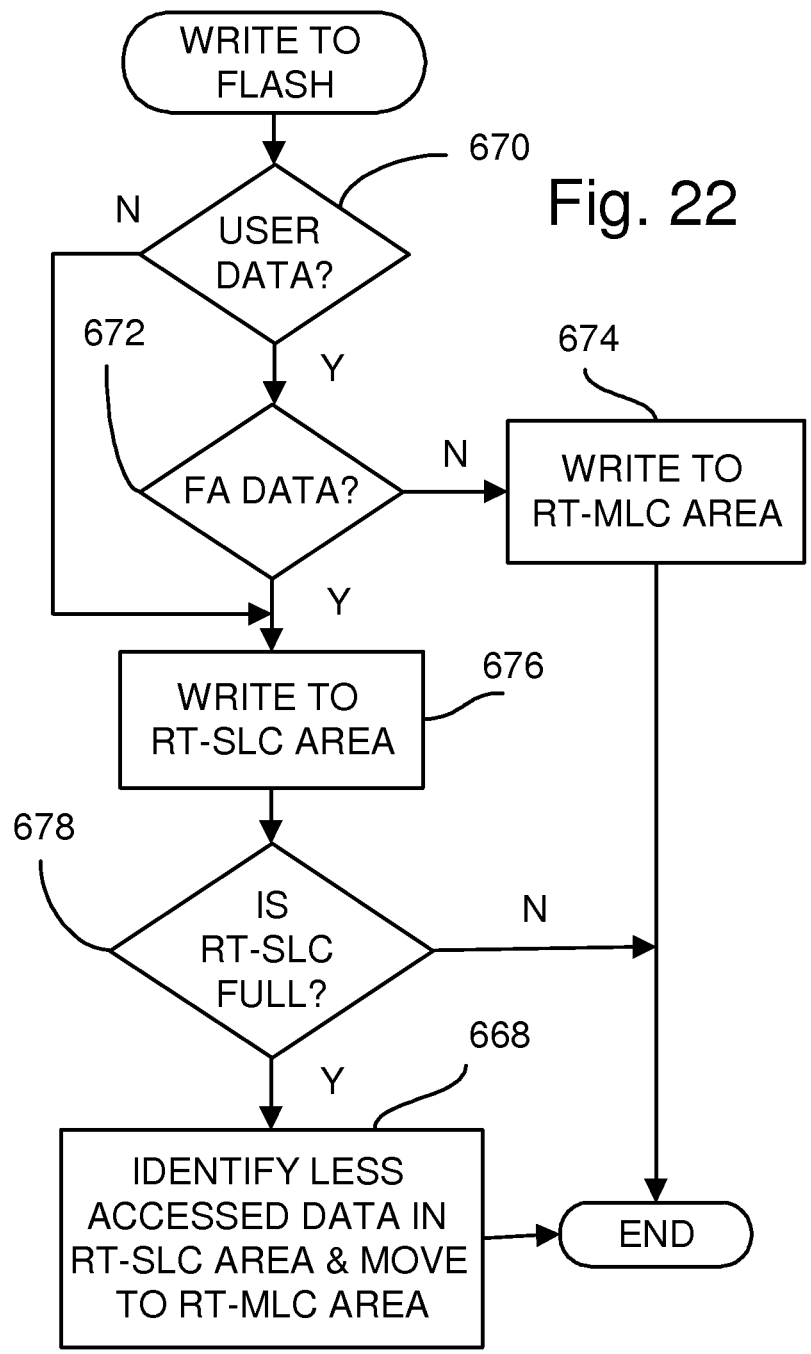
FIG. 22 shows a process for writing to a mixed-configuration flash.

FIG. 22 shows a process for writing to a mixed-configuration flash. When the write from the host is for user data, step 670, and the data is frequently Accessed (FA), step 672, then the user data is written to a block configured as RT-SLC in flash memory 124, step 676. When the user data is not frequently accessed, step 672, then the user data is written to a block configured as RT-MLC, step 674. Thus frequently accessed user data is written to SLC blocks, which have a higher endurance able to accept more program-erase cycles.

Host writes that are not user data, step 670, are also written to a block configured as RT-SLC in flash memory 124, step 676. Host data such as file meta-data are often over-written and are better stored in SLC than in MLC. When the RT-SLC area is full, step 678, then less frequently accessed data in the SLC area is identified and moved to a RT-MLC block, step 668.

Figure 23A:
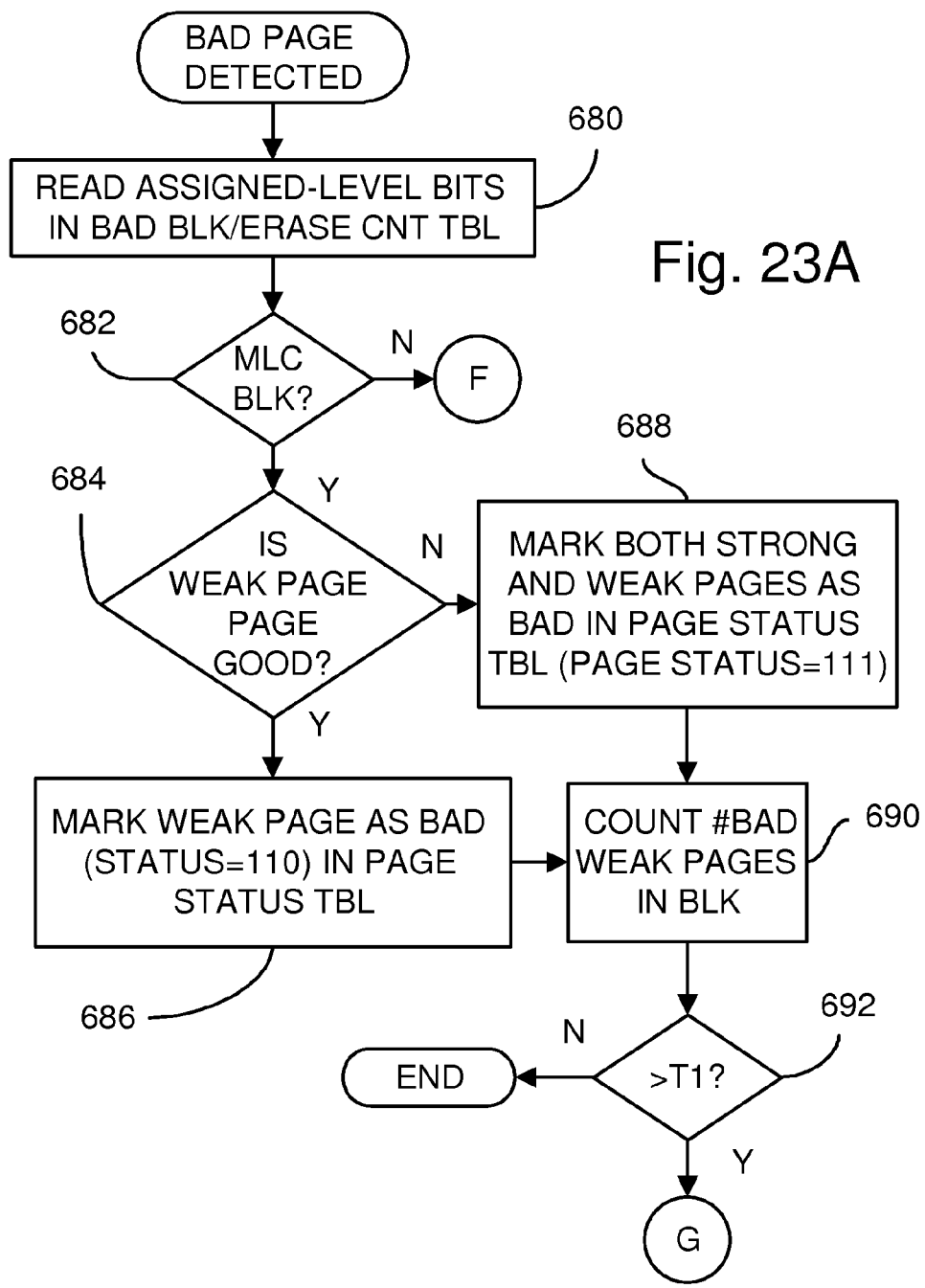
Figure 23B:
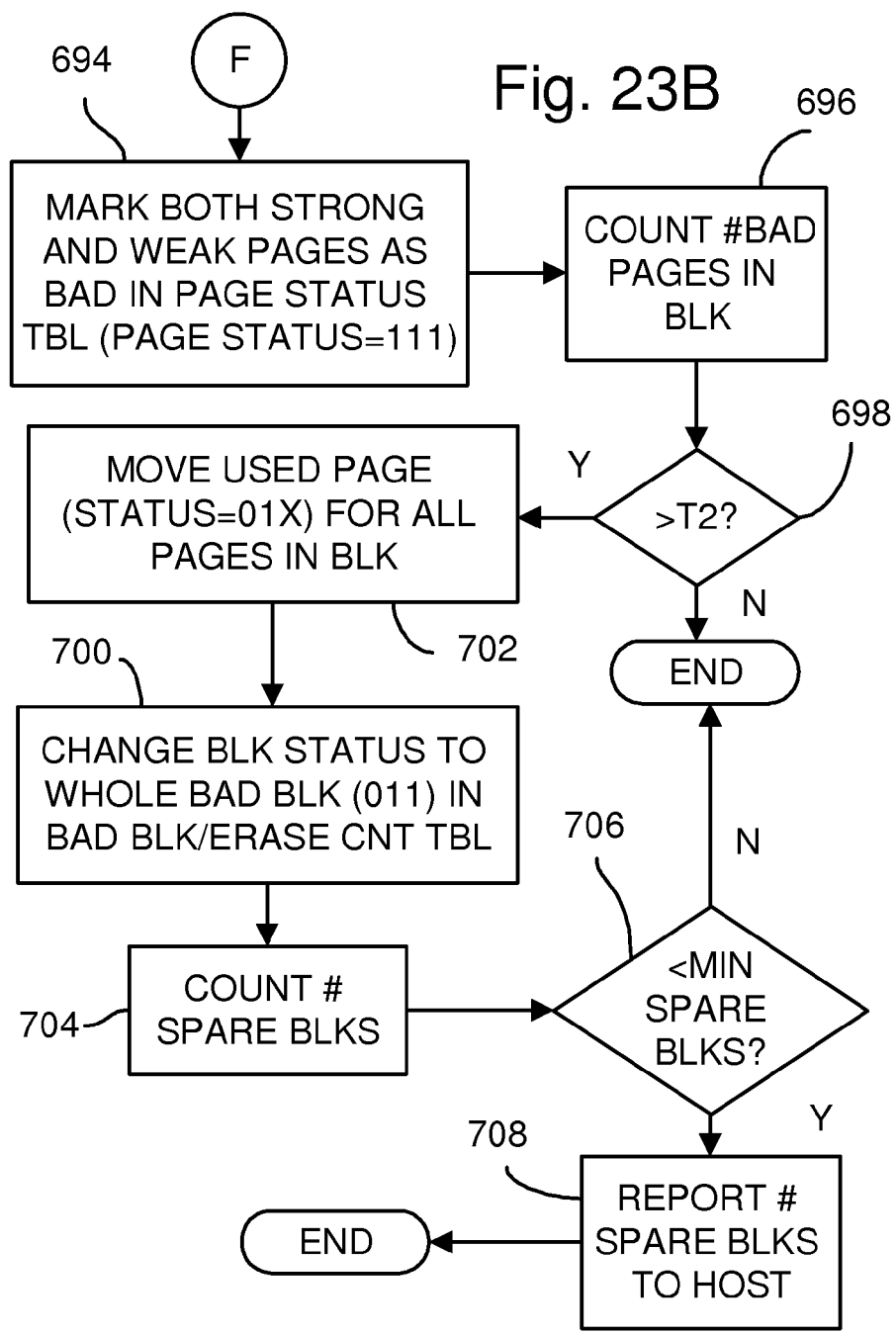

FIGS. 23A-C show a process for detection and handling of bad pages and bad blocks. In FIG. 23A, when a bad page is detected, such as by a read error, the assigned-level bits for the block containing the bad page are read from bad block/erase count table 471, step 680. When the assigned-level bits indicate that the bad page is in an MLC block, step 682, then firmware checks if the weak page of the paired page is marked as a good page or not. If the weak page is good, step 684, the weak page status is changed to indicate a bad weak page but a good strong page, page status 110, in page status table 473, step 686. When the weak page in the bad page is bad, step 684, the page status is changed to indicate that both paired pages are bad, page status 111, in page status table 473, step 688.

The number of bad weak pages in the block is determined, step 690. When the count of bad weak pages in the block exceeds threshold T1, step 692, the block is declared a bad MLC block (which uses strong and weak pages), but may still be used as a SLC block (only uses strong page). In FIG. 23C, used pages that have a page status of 01X in the block are moved to another block, step 710. The page status of all weak pages of paired pages in the old block are changed to 110, except that any bad pages with a status of 111 remain as bad pages, step 712. The status of all strong pages is set to 10×, step 713. The assigned-level bits are changed to SLC mode, 11, in bad block/erase count table 471, step 714. The old block's status is changed to 010, garbage pages in the block, step 716, in bad block/erase count table 471.

When the block is already a SLC block, step 682 of FIG. 23A, then the process of FIG. 23B is followed. The bad page's status is changed to 111, bad paired strong and weak page, in page status table 473, step 694. The number of bad strong pages in the block is determined, step 696. When the count of bad strong pages in the block exceeds threshold T2, step 698, the block is declared a bad SLC block. Used pages that have a page status of 01× in the block are moved to another block, step 702. The old block's status is changed to 011, whole bad block, step 700, in bad block/erase count table 471.

The number of spare blocks in the system are counted, step 704, and when the number of spare blocks is less than a target minimum, step 706, the number of spare blocks is reported to the host, step 708. Low levels of spare blocks cause the SSD to run slow and signals an end of life for the SSD. The host operator needs to take action to store the contents of the SSD and make a replacement if a new SSD is needed.

The SSD may contain many flash memory chips, such as 16 flash memory chips. Some special situations may be encountered, such as when one plane of the flash chip is bad or the whole chip is bad. If over provisioned, the flash capacity of the SSD can absorb the loss of capacity of one full plane or the whole flash memory chip. Special algorithms of the endurance controller can be used to bypass the losses, such as to recover the data and then adjust a meta-page unit size of the flash devices to avoid the faulty plane or chip. Over-provisioning also can be done by using idle chips for the replacement of the failed chip.

Figure 24:
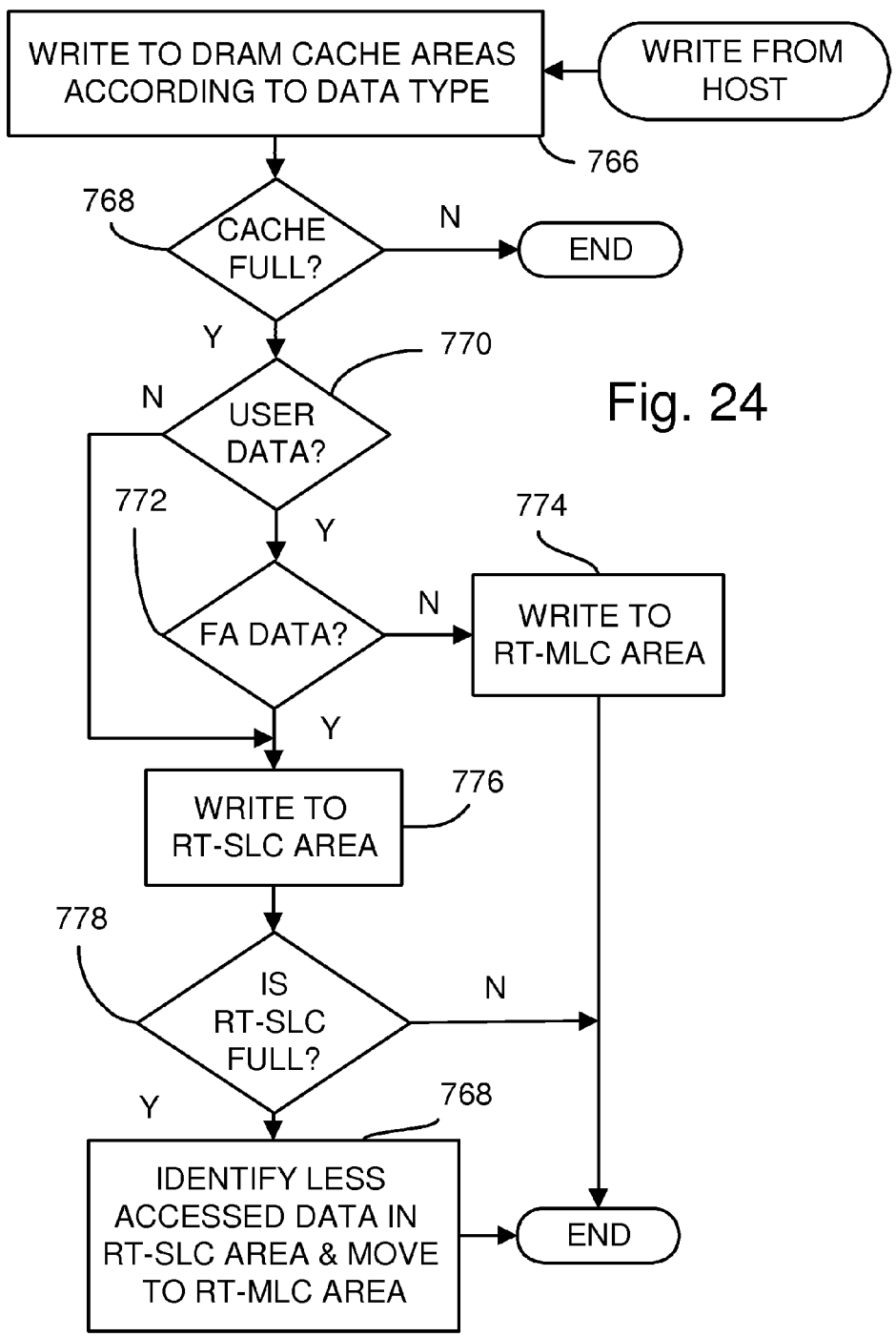
FIG. 24 shows a process for writing to a mixed-configuration flash with a DRAM cache.

FIG. 24 shows a process for writing to a mixed-configuration flash with a DRAM cache. Host data is first written to DRAM cache, step 766, which may be partitioned by data types. When the cache becomes full, step 768, then some of the data in the cache is castout.

When the castout data from the cache is for user data, step 770, and the data is frequently Accessed (FA), step 772, then the user data is written to a block configured as RT-SLC in flash memory 124, step 776. When the user data is not frequently accessed, step 772, then the user data is written to a block configured as RT-MLC, step 774.

Castout data that are not user data, step 770, are also written to a block configured as RT-SLC in flash memory 124, step 776. Cache castout data such as file meta-data are often overwritten and are better stored in SLC than in MLC. When the RT-SLC area is full, step 778, then less frequently accessed data in the SLC area is identified and moved to a RT-MLC block, step 768. Thus frequently accessed user data and meta-data are written to SLC blocks, which have a higher endurance able to accept more program-erase cycles.

Power Down and Restore

The endurance controller and flash memory may be provided with a backup power supply, a battery, a super-capacitor, or may tap into power from a desktop or tap into battery power from a laptop or portable device such as a smart phone. A three-signal code, the power backup module ID, may be input to or stored in the endurance controller to indicate what kind of backup power is available:

111 No backup power
011 Battery backup
101 Super-Capacitors
000 Tapped into Desktop power supply connector
110 Tapped into Laptop or portable Battery connector A super capacitor cannot support a refresh operation when the SSD is powered down due to its limited power density and longevity to hold the power.

Figure 25A:
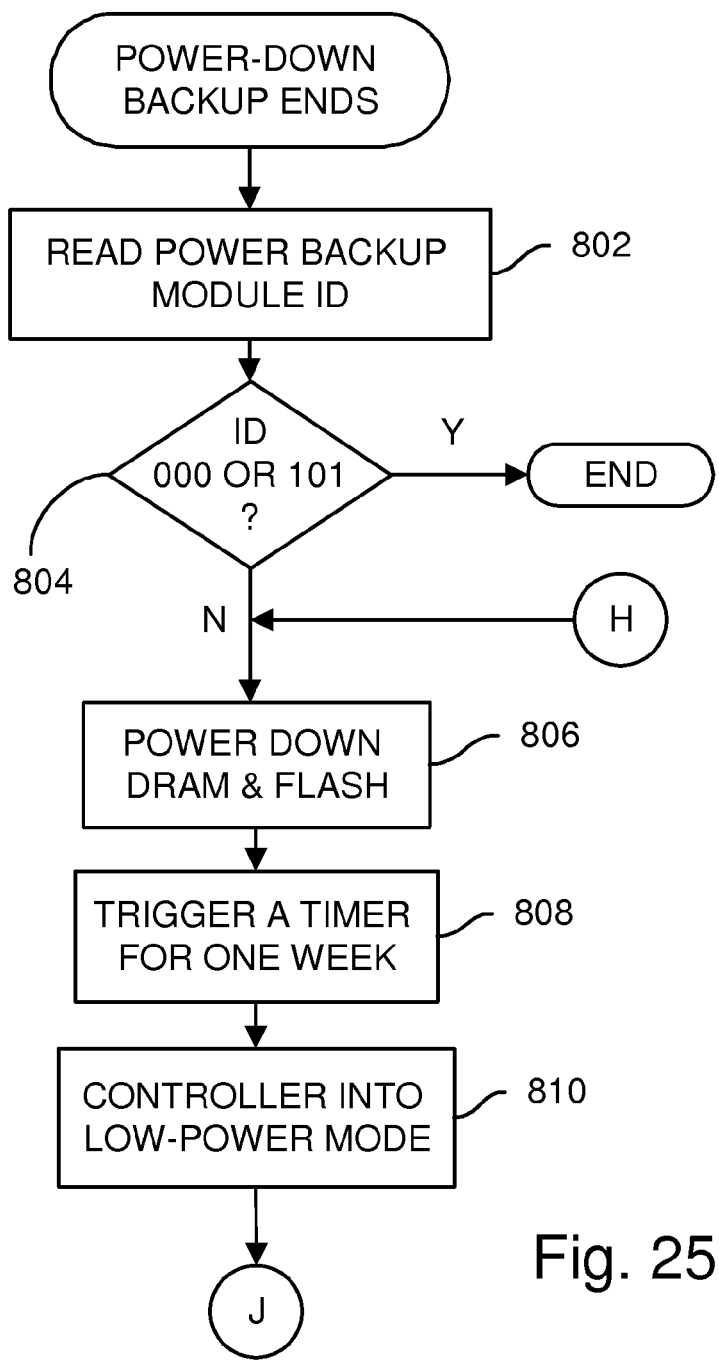
FIGS. 25A-B show a refresh routine activated when power is off.
Figure 25B:
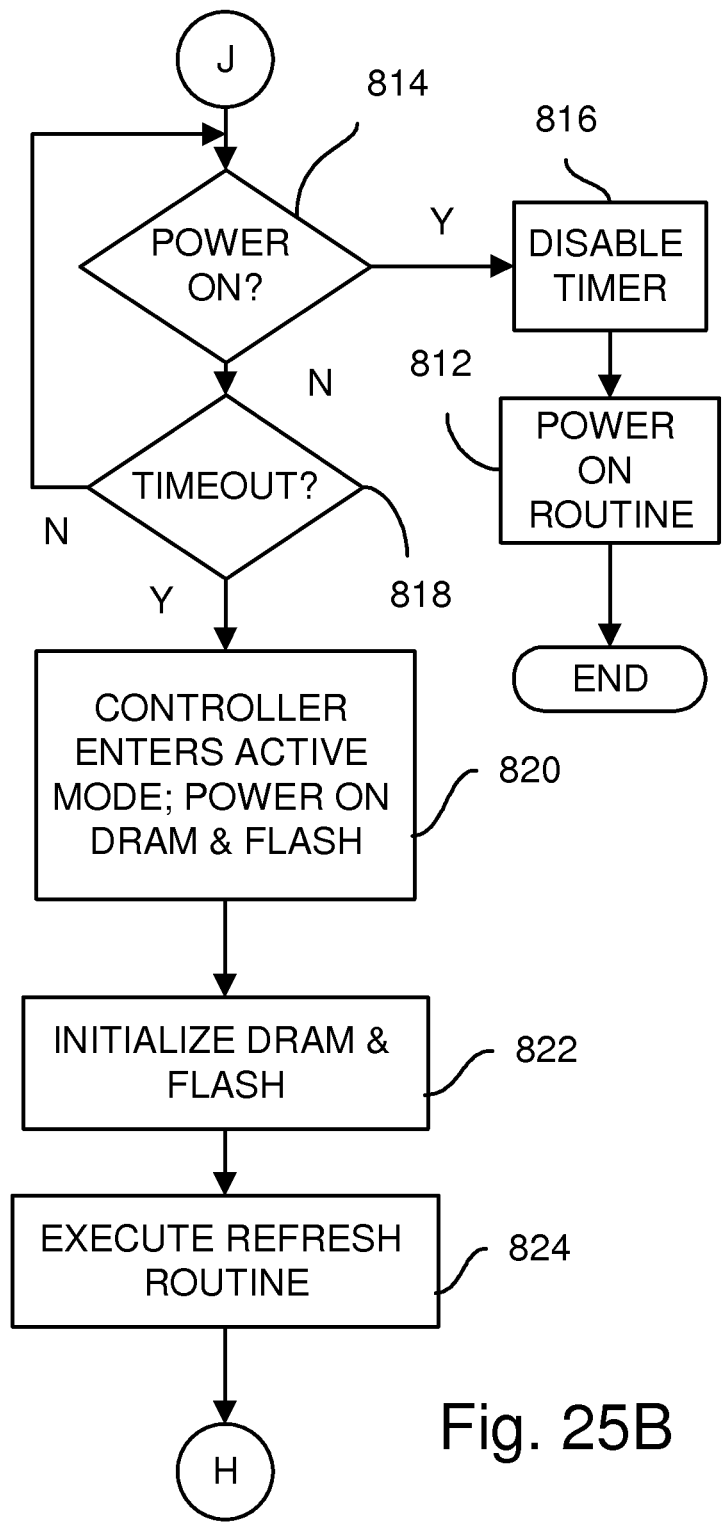

FIGS. 25A-B show a refresh routine activated when power is off. After the other power-down routines of the SSD are completed, the power backup module ID is read, step 802. When the power backup module ID is 000 or 101, step 804, there is either no backup power at all, or only super-capacitors which has too much leakage of charge to power refresh after a few days of capacitor leakage. The refresh routine is not performed.

When the power backup module ID is any other value, there is sufficient power to perform the refresh routine. The DRAM and flash are powered down, step 806. A timer is set to trigger in one week, step 808. The endurance controller enters a low-power mode, step 810.

In FIG. 25B, if the power is turned on before the week expires, such as by a user, step 814, then the timer is disabled, step 816, and the power on routine is executed, step 812. Otherwise, after a week when the timeout occurs, step 818, the endurance controller enters an active mode and the DRAM and flash memory are powered up, step 820. The DRAM and flash are initialized, step 822, and the refresh routine is executed, step 824 (Refer to FIGS. 20A,B). The refresh routine reads all flash data in MLC or TLC cells. The process repeats from step 806. The refresh routine prevents data loss in the flash memory cells for certain kinds of flash memory. For example, according to JEDEC standard JESD218A February 2011 at page 12 Table 3, after power off, enterprise MLC, which has only three months of data retention in a 40 degree C. environment, or consumer grade MLC, which has only one year of data retention in a 30 degree C. environment, can benefit with greater retention from the refresh routine.

Figure 26A:
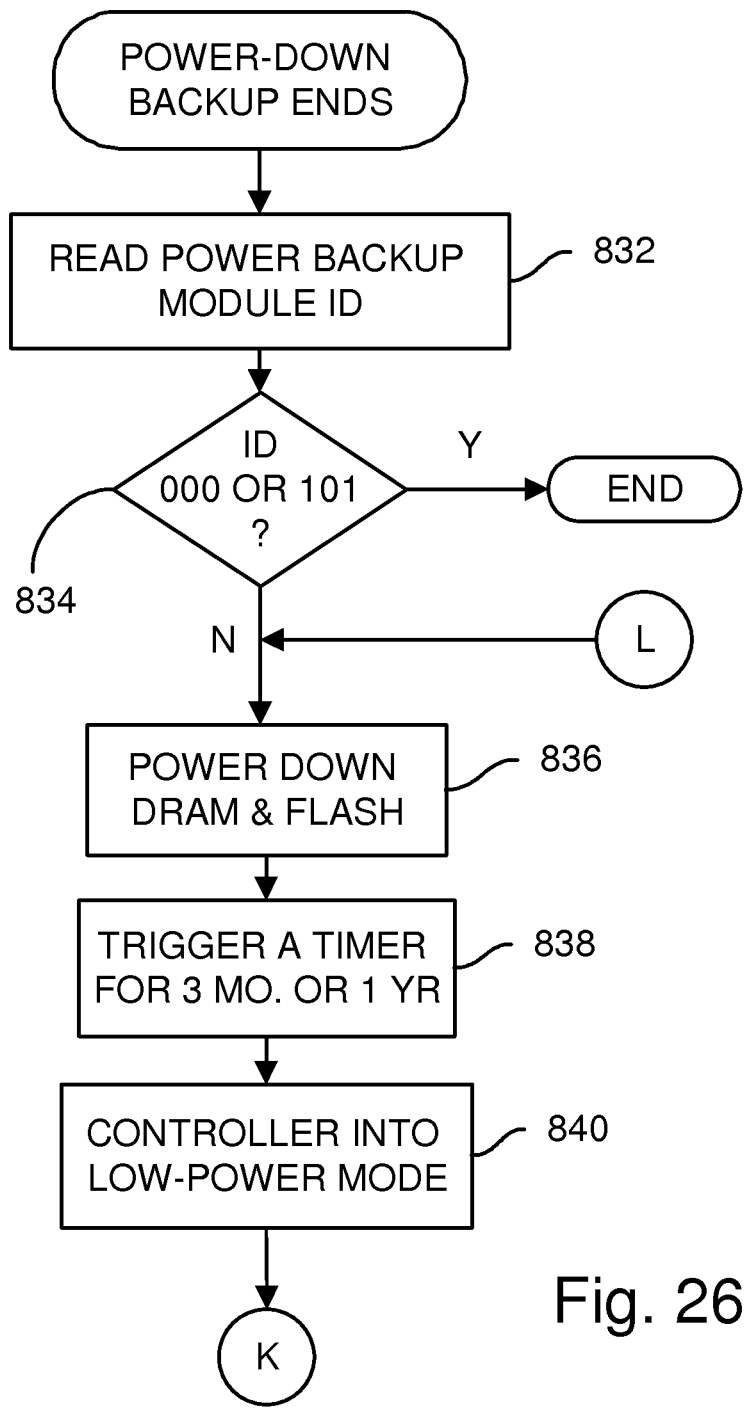
FIGS. 26A-B show a refresh routine that warms the flash cells that is activated when power is off.
Figure 26B:
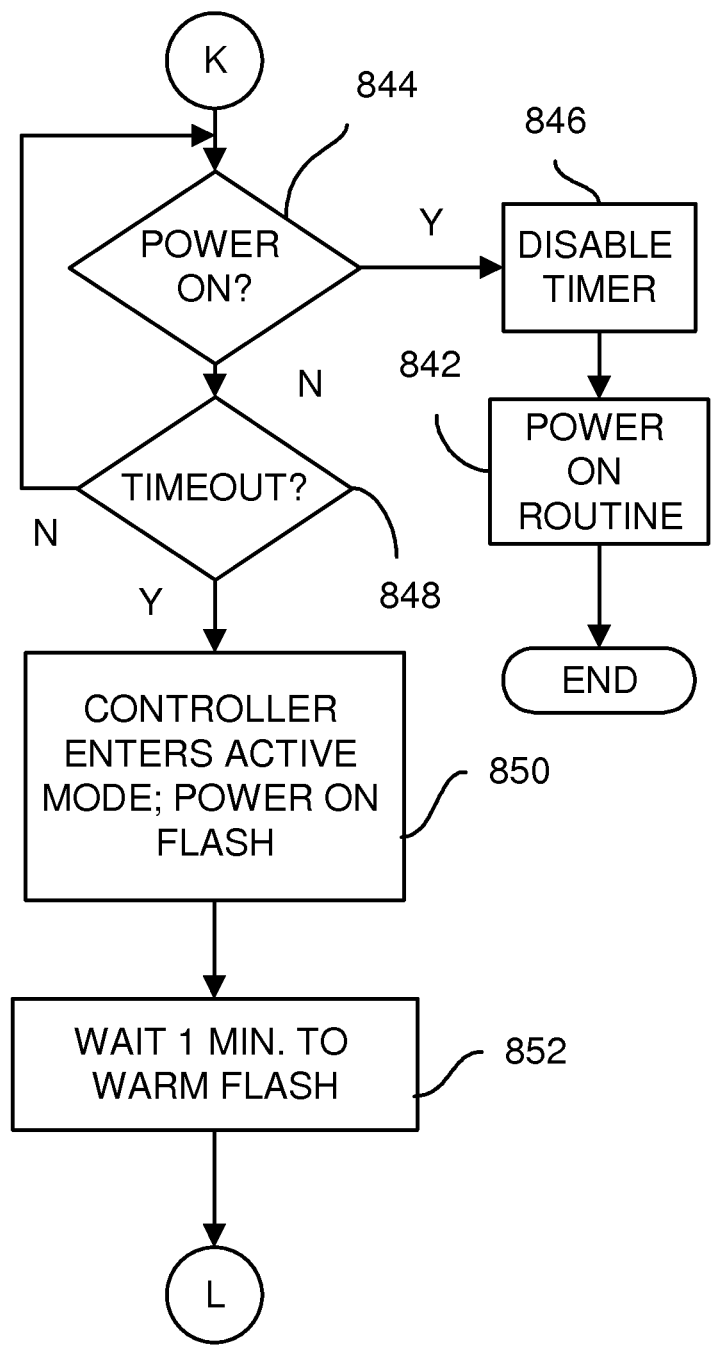

FIGS. 26A-B show a refresh routine that warms the flash cells that is activated when power is off. After the other power-down routines of the SSD are completed, the power backup module ID is read, step 832. When the power backup module ID is 000 or 101, step 834, there is either no backup power at all, or only super-capacitors which has too much leakage of charge to power refresh after a few days of capacitor leakage. The refresh routine is not performed.

When the power backup module ID is any other value, there is sufficient power to perform the refresh routine. The DRAM and flash are powered down, step 836. A timer is set to trigger in three months or one year, step 838. This longer timeout may correspond to the retention time for eMLC or other kinds of flash memory. The endurance controller enters a low-power mode, step 840.

In FIG. 26B, if the power is turned on before the time expires, such as by a user, step 844, then the timer is disabled, step 846, and the power on routine is executed, step 842. Otherwise, after three month or a year when the timeout occurs, step 848, the endurance controller enters an active mode and the flash memory is powered up, step 850. The flash is warmed up for about one minute, step 852. This warming prevents data loss in the flash memory cells for certain kinds of flash memory, for example, after power off, enterprise MLC, which has only three months of data retention in a 40 degree C. environment, or consumer grade MLC, which has only one year of data retention in a 30 degree C. environment. The process repeats from step 836.

Figure 27:
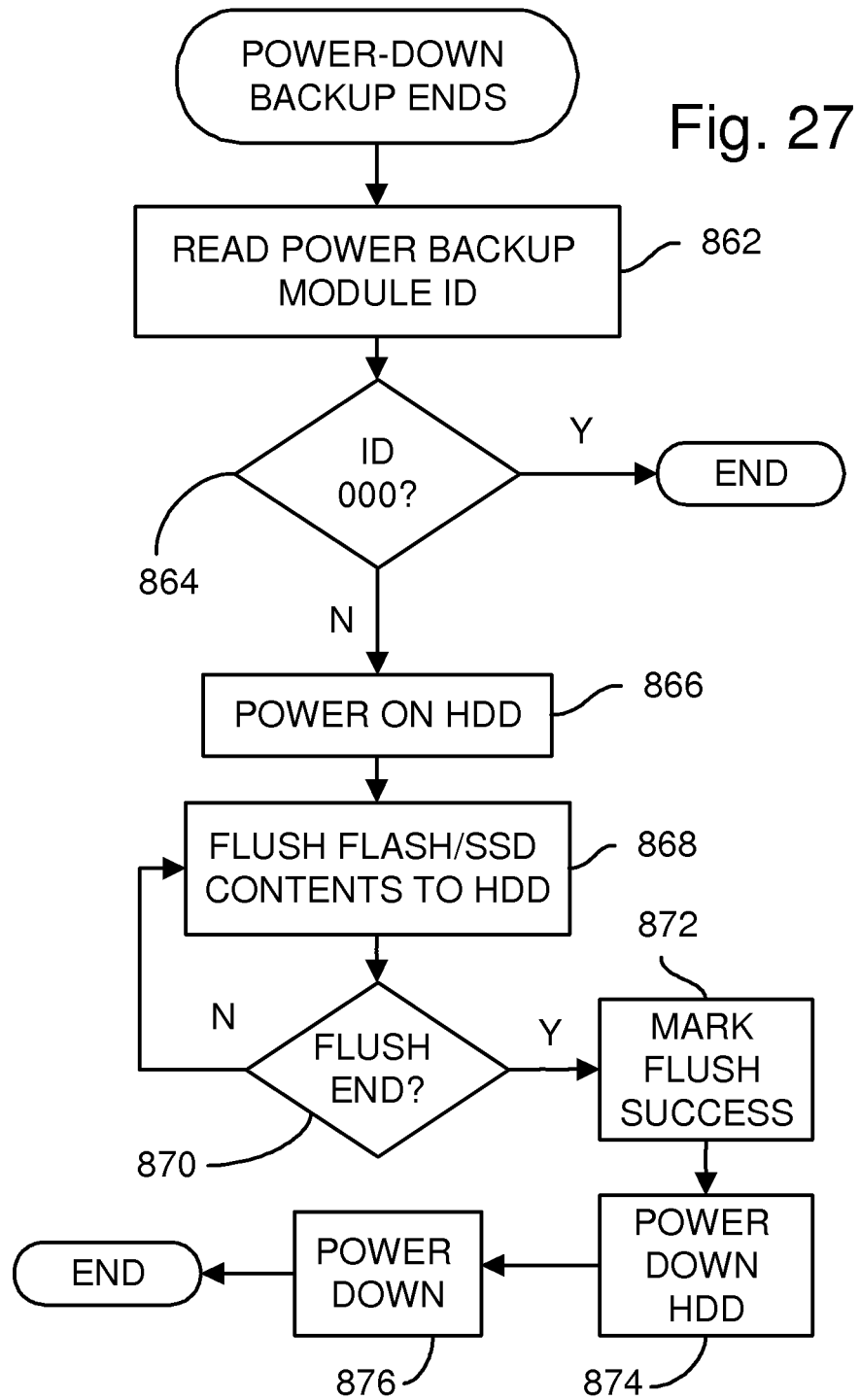
FIG. 27 is a process for flushing flash data to a Hard Disk Drive (HDD).

FIG. 27 is a process for flushing flash data to a Hard Disk Drive (HDD). The HDD may be local HDD 23 of FIG. 13 that is accessed through HDD interface 14 in endurance controller 192. Storing the contents of SSD to a HDD can avoid a problem when the SSD is turned off for more than 3 months and there is no backup power available to refresh the SSD flashes. Refer to FIGS. 25A,B.

After the other power-down routines of the SSD are completed, the power backup module ID is read, step 862. When the power backup module ID is 000, step 864, there is no backup power at all. The flush routine is not performed.

When the power backup module ID is any other value, there is sufficient power to perform the flush routine. The HDD is powered on, step 866. All flash memory or SSD contents (file system, meta data, etc.) are copied to the HDD, step 868. Once the flush to HDD is completed, step 870, the flush is marked as a success, step 872, such as by setting a flag or bit in a register or memory location stored on the HDD. The HDD is powered down, step 874, and the endurance controller, flash memory, and any DRAM is powered down, step 876.

FIG. 28 is a process for restoring flushed flash data from a HDD. The HDD may be local HDD 23 of FIG. 13 that is accessed through HDD interface 14 in endurance controller 192. The local HDD is powered up, step 886, and the flush status is read from the local HDD, step 884.

When the status bit read from the HDD indicates a flush failure, step 880, the flushed data is unreliable. A warning is sent to the host, step 888. The local HDD is powered down, step 892.

When the status bit read from the HDD indicates a flush success, step 880, the flushed data is read from the HDD and used to repair the contents of the flash memory or SSD, step 890. Flash data may be read and compared to the flushed data read from the HDD and the flash data replaced when a mismatch occurs. The local HDD is powered down, step 892.

FIG. 29 is a process for flushing flash data to a HDD through a PCIe controller or host. The HDD may be HDD 21 of FIG. 13 that is accessed through PCIe RAID controller 19. In case of PCIe RAID 19, the backup power is provided to the PCIe RAID controller, and the controller firmware will use a vendor command to request endurance controller 192 to dump the image of its flash memory 124 to HDD 21.

After the other power-down routines of the SSD are completed, the power backup module ID is read, step 902. When the power backup module ID is 000, step 904, there is no backup power at all. The flush routine is not performed.

When the power backup module ID is any other value, there is sufficient power to perform the flush routine. The flash memory or SSD contents are copied to the HDD 21 through the PCIe RAID controller 19, step 906. Once the flush to HDD is completed, step 910, the flush is marked as a success, step 912, such as by setting a flag or bit in a register or memory location stored on the HDD. The endurance controller, flash memory, and any DRAM is powered down, step 916.

FIG. 30 is a process for restoring flushed flash data from a HDD through a PCIe controller. The remote HDD may be remote HDD 21 of FIG. 13 that is accessed through PCIe RAID controller 19.

The flush status is read from the remote HDD, step 924. When the status bit read from the HDD indicates a flush failure, step 920, the flushed data is unreliable. A warning is sent to the host, step 928.

When the status bit read from the HDD indicates a flush success, step 920, the flushed data is read from the HDD and used to repair the contents of the flash memory or SSD, step 930. Flash data may be read and compared to the flushed data read from the HDD and the flash data replaced when a mismatch occurs.

Alternate Embodiments

Several other embodiments are contemplated by the inventors. For example, the number of pages per block can be 4, 8, 16, 32, 64, 128, 192, 256, or some other number. The number of physical blocks in the system can increase, and blocks can be partitioned among data and overhead pools in various ways and also dynamically. The sector size could vary from the 512-byte sector described. The page size can be 512 bytes, 2K, 4K bytes or higher, and could dynamically vary with the assigned-level bits or bits-per-cell indicator for multi-level cell flash memory, but the sector size inherited from hard disk drives may remain 512 bytes for compatibility reasons. Other bits may be stored with each page or with each block, such as LRU bits, management or coherency bits, dirty bits, other counters, etc.

The level bits or assigned-level bits could be stored for each block, or for each page. Global level bits for a whole flash chip, or for the entire SSD could also be used. The TLC, MLC, eMLC, or other flash memory chip could have an input or register that indicates if the chip is to write to a strong page (SLC) or to a weak page (MLC or TLC). Alternately, a range of pages may be designated as SLC pages, another range of pages as MLC, etc. Firmware or the endurance controller could write a page within a range of SLC pages and set the SLV level bit (L2) in a DRAM buffer or in a flash overhead, and then write to another page in a range of MLC pages and write the next level bit (L1) to indicate that both the SLC and MLC pages were written.

The reference voltages could be adjusted for other reasons, such as to track temperature, process, and supply-voltage variations. Comparators could be differential comparators or op amps. Differential bit lines rather than single bit lines could be substituted. Various sense amps, latches, pre-charge, logic, buffering, and other circuitry could be added. A variety of floating-gate and other technologies could be used for cell storage.

Blocks or pages could be downgraded. The assigned-level, level bits or bits-per-cell indicator could be a single indicator for a block, or separate indicators for pages, or redundant indicators. Blocks that contain critical data such as boot code could remain in a downgraded state to improve reliability, even when no errors occur.

Some blocks may be faulty and are removed from the pool of erased blocks. A flash-memory controller may implement the functions described and be located on a flash-memory card or motherboard or other card. A host bus such as a Peripheral Component Interconnect Express (PCIe) bus with a PCIe interface, or a USB interface to a USB bus may be added. Rather than being on a card, the device might be a module or may be located on one or more chips or on several boards or on a motherboard.

Different kinds of flash memory may erase to 0, and only allow writing to 1, not writing from 1 to 0. Some flash memory may allow page erase, rather than whole block erase. Events may occur exactly when described, or could occur at other times. Valid bits may change to the erased state near but not exactly at the time of physical erasing, such as before or after the actual erase operation. Pipelining, buffering, and other time-shifting operations may be used. Wait states that delay operations may be added, such as when erasing is very slow.

For a TLC flash device, the DRAM buffer can be substituted with NVRAM such as phase-change memory (PCM), ferroelectric random-access memory (FRAM), Magnetoresistive RAM (MRAM), Memristor, PRAM, Resistive RAM (RRAM), Racetrack memory, and nano RAM (NRAM) etc. The advantage of NVRAM is that all the firmware supported tables etc. may remain in NVRAM (no need to put in the flash memory) and other flash memory destined data (such as data write cache etc.) is retained even with power off, so the backup power circuit is no longer needed even when power is turned off suddenly. A tmp etc. & mapping table, and read cache & mapping tables can be optionally discarded at the power down or at the next power up initialization. Other than MLC, the disadvantage of NVRAM is the cost. For MLC, the disadvantage is slow speed and limitations on write/erase times.

In the TLC flash device, the DRAM buffer also can be substituted with combinations such as DRAM+SRAM, DRAM+MLC, DRAM+PCRAM or DRAM+MRAM. When combinations of DRAM buffering are used such as DRAM+MLC, the supported functions are managed in DRAM but some of them may be stored in MLC. Some of the data in the DRAM buffer can be discarded eventually such as temp. data and mapping tables, and read cache and mapping tables, that are not moved to MLC when power is off. Tables and data that need to be kept when power is off such as the block erase count table, the page Status table, S.M.A.R.T. data collector, etc. need to be stored to MLC when power is turned off suddenly. The copying method can be modified by recording minor differences, which will reduce the amount of copying data and therefore reduce the writes to MLC.

DRAM and MLC or DRAM and SLC do not necessary use different types of flash such as SLC, MLC, TLC, QLC, PLC, 3D NAND etc. Instead, the MLC can be derived from the TLC by allocating a part of the TLC that only has strong pages programmed. The SLC can be derived from MLC, TLC, QLC, PLC, etc. by allocating part of the MLC, TLC, QLC, PLC, etc. that only has strong pages programmed. For example, an Enhanced TLC Flash can be realized by a portion of TLC configured as SLC (with strong pages) using such as one quarter of the TLC used as SLC (strong page) and the reminder of TLC as TLC (weak page). Or a portion of TLC configured as MLC (strong page) and the reminder of TLC as TLC (weak page). Additionally, the program/erase manager may slow down page writing and block erasing time to help prolong the life of the oxide layer of cells of the flash. The slower page write/block erase time can be applied to RT-TLC flash to increase the endurance at the expense of decreased retention time. By using refresh manager 202, the retention time of data can be increased by moving data to a new location. Due to the RT-Flash including SLC (strong page) and TLC (weak page) and with differing retention times, refresh manager 202 can track the usage of blocks as SLC (strong page) or TLC (weak page) and then adjust the refresh time accordingly. Alternatively, an enhanced TLC Flash can be realized by a portion of TLC configured as SLC (strong page) usage such as one quarter of TLC used as SLC (strong page). Similarly, MLC can be used as combination of SLC(strong page)/MLC(weak page) and QLC can be used as combinations such as SLC(strong page)/QLC(weak page), MLC (strong page)/QLC(strong page), TLC(strong page)/QLC (strong page), or any combination of SLC/MLC/TLC/QLC. Alternatively, MLC can be used as SLC (strong page), etc. The above functions also can be implemented in endurance controller 192.

While portions such as one-quarter or 25% have been shown in FIGS. 14C, 16C, 17C, 18D-F, other portions could be substituted, such as 10%, 40%, etc.

The endurance technologies described herein attempt to solve the endurance issues of NAND flash memory. There are several non-volatile memories, such as MRAM, PCM, RRAM, Memristors, NRAM, etc. which are using competing technologies to replace NAND flash memory.

While the invention has been described as storing up to 3 bits per flash cell, with a total of 8 possible states, the invention could be extended to cells storing N bits per cell, for a total of $2^N$ states, with $2^N-1$ reference voltages. The reference voltages could be evenly spaced, or could have varying voltage gaps. Rather than voltage comparators and voltage references, current comparators or current references could be used. The control engine or other controller may be able to re-map flash cells that do not verify between the upper and lower limits to improve overall reliability. The average of the upper and lower counts could be an exponential average, and arithmetic average, a median, or another kind of average. The middle-count calibration test could be repeated many times and averaged.

The flash architecture could be implemented as a stand-along chip, or as part of a larger system on a chip. A variety of technologies for the flash cell may be used. The floating gate may be a polysilicon or composite-material gate, or may be an electron or charge-trapping layer such as a nitride film between the control gate and the drain. Multi-level flash cells use one cell to store multiple levels, while Nitride Read-Only Memory (NROM) technology uses one cell to store multiple bits. The invention may also be applied to NROM technology as well. Flash memory often is able to erase large blocks of cells at a time, rather than individually, but either block-erase or individual-cell-erase or some other erase granularity could be supported with the invention.

Logic states and voltages can be complemented and inverted in various ways. For example, the + and − inputs to comparators may be swapped. Inversions may be added or removed. Many circuit and logic implementations are possible for the various blocks and circuits. The control-gate voltage may be VL0, the lowest limit voltage of the sensing node, or may be some other value, and may even be the normal power-supply voltage Vcc. Using VL0 for both the gate and lower limit voltages may simplify the circuits. The current corresponding to VL0, IL0, and for other voltages and currents, may be substituted in some circuits.

The bit-line voltage and the sensing-node voltage may differ slightly, such as due to a voltage drop by a pass transistor connecting the two, or may be the same. For simplification of the description, the sensing and bit-line voltages are sometimes used interchangeably, but they may actually differ somewhat. Voltages along bit and sense lines may also differ due to loading effects and line resistances Likewise the substrate voltage inside the cell, on the bit line, or after a sense amplifier may differ.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A mixed-mode flash memory chip comprising:
   a flash memory having a plurality of blocks of flash memory cells that are Triple-Level-Cell (TLC) cells that are capable of storing three binary bits per physical flash memory cell, each flash memory cell having eight logic states determined by multiple voltage levels;
   wherein each block of the flash memory cells are capable of programming only one binary bit per physical memory cell when operating in a Single-Level-Cell (SLC) mode and are capable of programming two binary bits per physical memory cell when operating in a Multi-Level-Cell (MLC) mode;
   a plurality of voltage references generated from a first reference voltage, the plurality of voltage references being in a sequence of differing values;
   a plurality of comparators that generate a plurality of compare results by comparing a bit line connected to a flash memory cell to the plurality of voltage references;
   two external mode pins for configuring the entire mixed-mode flash memory chip to function as TLC, MLC, or SLC;
   two internal mode registers for logically combining with the two external mode pins, the two internal mode registers being programmable by firmware to configure the whole chip to function as TLC, MLC, or SLC;
   two mode registers for each block of the flash memory cells, wherein the two mode registers are logically combined with the two external mode pins and the two internal mode registers when the block of the flash memory cells is being accessed, wherein the two mode registers for each block are programmable by firmware to configure the block of the flash memory cells to function as TLC, MLC, or SLC;
   a set of programmable level registers for each block of the flash memory cells, the set of programmable level registers only usable when the entire mixed-mode flash memory chip is configured to be either MLC or SLC;
   translation logic with truth table logic under control of the two external mode pins, the two internal mode registers, the set of programmable level registers, and the two mode registers for each block of the flash memory cells, the translation logic receiving the plurality of compare results as inputs;
   wherein in SLC mode, the translation logic generates one read data bit for a selected cell according to the truth table logic;
   wherein in MLC mode, the translation logic generates two read data bits for the selected cell according to the truth table logic; and
   wherein in TLC mode, the translation logic generates three read data bits for the selected cell according to the truth table logic.

2. The mixed-mode flash memory chip of claim 1 further comprising:
   a calibration register for adjusting the first reference voltage applied to the plurality of voltage references.

3. The mixed-mode flash memory chip of claim 1 wherein the two external mode pins are hard-wired within a chip package to configure the entire mixed-mode flash memory chip as TLC, MLC or SLC.

4. The mixed-mode flash memory chip of claim 1 wherein the two external mode pins of the mixed-mode flash memory chip are connected on a Printed Circuit Board to configure the entire mixed-mode flash memory chip as TLC, MLC or SLC.

5. The mixed-mode flash memory chip of claim 1 wherein the two internal mode registers of the mixed-mode flash memory chip further comprise:
   flash memory register cells that are programmable by a flash controller to configure the entire mixed-mode flash memory chip as TLC, MLC or SLC.

6. The mixed-mode flash memory chip of claim 1 wherein the two mode registers for each block of the flash memory cells further comprises:
   flash memory register cells that are programmable by a flash controller to configure each block as TLC, MLC or SLC;
   wherein blocks of the flash memory cells are capable of a mixed combination of TLC, MLC, and SLC blocks.

7. The mixed-mode flash memory chip of claim 1 wherein the set of programmable level registers for each block of the flash memory cells further comprises:
   flash memory register cells that are programmable by a flash controller to modify results generated by the truth table logic of the translation logic;
   wherein the translation logic generates two different sets of level control including a first set of level control for write access and a second set of level control for read access.

8. The mixed-mode flash memory chip of claim 1 wherein the flash memory cells are capable of storing four binary bits per physical flash memory cell;
   wherein four binary bits per memory cell are stored for TLC cells, wherein 16 levels determined by multiple voltage levels are mapped to eight logic states for TLC mode by the translation logic;
   wherein multiple levels determined by the multiple voltage levels are mapped to a logic state for TLC mode.

9. The mixed-mode flash memory chip of claim 1 wherein the flash memory cells are 3D NAND flash memory cells.

* * * * *